(12) United States Patent
Sogoh et al.

(10) Patent No.: US 9,177,980 B2
(45) Date of Patent: Nov. 3, 2015

(54) SOLID-STATE IMAGING DEVICE AND ELECTRONIC INSTRUMENT

(71) Applicant: Sony Corporation, Tokyo (JP)

(72) Inventors: Yasunori Sogoh, Kanagawa (JP); Hiroyuki Ohri, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/583,888

(22) Filed: Dec. 29, 2014

(65) Prior Publication Data

US 2015/0115336 A1    Apr. 30, 2015

Related U.S. Application Data

(63) Continuation of application No. 13/070,608, filed on Mar. 24, 2011, now Pat. No. 8,947,573.

(30) Foreign Application Priority Data

Mar. 31, 2010 (JP) .................................. 2010-082772

(51) Int. Cl.
*H04N 5/335* (2011.01)
*H01L 27/146* (2006.01)
*H04N 5/361* (2011.01)

(52) U.S. Cl.
CPC .... *H01L 27/14612* (2013.01); *H01L 27/14609* (2013.01); *H01L 27/14643* (2013.01); *H04N 5/335* (2013.01); *H04N 5/361* (2013.01)

(58) Field of Classification Search
CPC ............. H04N 5/335; H01L 27/14609; H01L 27/14612; H01L 27/14643
USPC .......................................................... 348/311
See application file for complete search history.

(56) References Cited

U.S. PATENT DOCUMENTS 6,809,359 B2   10/2004   Yamada
7,342,269 B1 *  3/2008   Yuzurihara ................... 257/292
7,531,885 B2 *  5/2009   Okita et al. ................... 257/444

(Continued)

FOREIGN PATENT DOCUMENTS

CN   101359675 A   2/2009
CN   101673749 A   3/2010

(Continued)

OTHER PUBLICATIONS

Chinese Office Examination Report issued in connection with related Chinese patent application No. CN 201110079165.9 dated Oct. 10, 2014.

*Primary Examiner* — Aung S Moe
*Assistant Examiner* — Amy Hsu
(74) *Attorney, Agent, or Firm* — Dentons US LLP

(57) ABSTRACT

Disclosed herein is a solid-state imaging device including, a first semiconductor region of the first conduction type, a photoelectric conversion part having a second semiconductor region of the second conduction type formed in the region separated by the isolation dielectric region of the first semiconductor region, pixel transistors formed in the first semiconductor region, a floating diffusion region of the second conduction type which is formed in the region separated by the isolation dielectric region of the first semiconductor region, and an electrode formed on the first semiconductor region existing between the floating diffusion region and the isolation dielectric region and is given a prescribed bias voltage.

10 Claims, 14 Drawing Sheets

(56) References Cited

U.S. PATENT DOCUMENTS

| | | | |
|---|---|---|---|
| 7,846,758 B2 * | 12/2010 | Ohkawa | 438/48 |
| 2007/0085110 A1 * | 4/2007 | Okita et al. | 257/239 |
| 2007/0278536 A1 * | 12/2007 | Adachi | 257/239 |
| 2008/0070341 A1 * | 3/2008 | Yuzurihara | 438/59 |
| 2010/0073541 A1 * | 3/2010 | Kawahito | 348/311 |
| 2010/0201854 A1 * | 8/2010 | Iwabuchi | 348/294 |
| 2010/0201859 A1 * | 8/2010 | Mouli et al. | 348/308 |
| 2010/0245633 A1 * | 9/2010 | Hanada | 348/246 |
| 2011/0013062 A1 * | 1/2011 | Yamashita | 348/294 |
| 2011/0025892 A1 * | 2/2011 | Hibbeler et al. | 348/294 |
| 2011/0187908 A1 * | 8/2011 | Kawahito et al. | 348/306 |

FOREIGN PATENT DOCUMENTS

| | | |
|---|---|---|
| JP | 2001-028433 | 1/2001 |
| JP | 2005-142503 | 6/2005 |
| JP | 2006-216616 | 8/2006 |
| JP | 4247235 | 1/2009 |

* cited by examiner

US 9,177,980 B2

SOLID-STATE IMAGING DEVICE AND ELECTRONIC INSTRUMENT

RELATED APPLICATION DATA

This application is a continuation of U.S. patent application Ser. No. 13/070,608 filed Mar. 24, 2011, the entirety of which is incorporated herein by reference to the extent permitted by law. The present application claims the benefit of priority to Japanese Patent Application No. JP 2010-082772 filed on Mar. 31, 2010 in the Japan Patent Office, the entirety of which is incorporated by reference herein to the extent permitted by law.

BACKGROUND OF THE INVENTION

1. Field of the Invention

The present invention relates to a solid-state imaging device and an electronic instrument, such as camera, equipped with the solid-state imaging device.

2. Description of the Related Art

Among known solid-state imaging devices (or image sensors) are CCD (Charge Coupled Device) solid-state imaging devices and CMOS (Complementary Metal Oxide Semiconductor) solid-state imaging devices. They are used for digital still cameras, digital video cameras, and various portable terminal equipment such as portable telephone with a built-in camera.

The generally-known CCD solid-state imaging device has photoelectric conversion elements (photodiodes) arranged in an array and also has between their rows the vertical transfer parts of CCD structure which read out the charges resulting from photoelectric conversion. It additionally has the horizontal transfer part of CCD structure, which transfers the signal charges sent from the vertical transfer parts, and the output part, which converts the signal charges sent from the horizontal transfer part into voltage and then sends it out. The CCD solid-state imaging device mentioned above has the vertical transfer part, the horizontal transfer part, and the output part covered with a light-shielding film of metallic material such as tungsten. And the light-shielding film has openings formed on the photoelectric conversion elements individually.

Among the known CMOS solid-state imaging devices is the solid-state imaging device which, owing to its global shutter function, transfers the signal charges (resulting from photoelectric conversion by the photoelectric conversion element or the photodiode) all at once to the charge holding part. Like the CCD solid-state imaging device, the solid-state imaging device with the global shutter function also has the light-shielding film of tantalum or tungsten that covers its surface except for the photodiodes and contact openings.

There are new CCD solid-state imaging devices under development which permit the light-shielding film to function as an electrode for reduction of dark current. An example of such CCD solid-state imaging devices is shown in FIG. 17, cited from Patent Document 1. It includes of the n-type semiconductor substrate 301, the p-type well region 302, and the n-type semiconductor region (or photodiode) 303 for photoelectric conversion, which are sequentially formed one over another. The photoelectric conversion region 303 has the accumulation region 329 of high concentration p-type, which is formed on the surface thereof. The p-type well region 302 has the p-type read-out region 305, the n-type transfer channel region 304, and the p-type channel stop region 306, which are formed therein. The n-type transfer channel region 304 has the p-type well region 308, which is formed immediately thereunder.

On the n-type transfer channel region 304, the p-type read-out region 305, and the p-type channel stop region 306 is formed the transfer electrode 311, with the gate insulating film interposed between them. On the transfer electrode 311 are formed the interlayer insulating film 314, with the conductive light shielding film 315 interposed between them, and the transparent conductive film 321. At the top are sequentially formed the planarizing film 318, the color filter layer 319, and the on-chip microlens 320.

The CCD solid-state imaging device (shown in FIG. 17) according to Japanese Patent No. 4247235 which is hereinafter referred to as Patent Document 1 has the conductive light shielding film 315 and the transparent conductive film 321, which are formed on the photoelectric conversion region 303, with the interlayer insulting film 314 interposed between them. These components constitute the MOS (Metal Oxide Semiconductor) capacitor structure. This structure causes the accumulation region 329 of high concentration p-type to be formed on the surface of the photoelectric conversion region 303 by application of minus voltage to the conductive light shielding film 315 and the transparent conductive film 321. The p-type accumulation region 329 formed by voltage application traps the dark current that occurs on the substrate surface in the photoelectric conversion region 303. The application of minus voltage to the conductive light shielding film 315 from voltage application means causes the signal charges to be read out to the n-type transfer channel 304 of the vertical transfer part. This step involves application of a voltage of 0 V or opposite polarity of minus polarity to the conductive light shielding film 315 from the voltage application means.

In the case of the CMOS solid-state imaging device, the floating diffusion part (FD part for short hereinafter) needs a holding time of several microseconds in normal operation or a holding time longer than the frame rate if the global shutter is to work. This poses a serious problem with the reduction of dark current in the FD part as in the case of photodiode. Unfortunately, the reduction of dark current in the FD part is not achieved effectively by the solid-state imaging device constructed as mentioned above.

An example of CMOS solid-state imaging devices is shown in FIG. 18, cited from Japanese Patent Laid-open No. 2005-142503 which is hereinafter referred to as Patent Document 2. The illustrated CMOS solid-state imaging device includes the n-type semiconductor substrate 2201, the p-type well region 2202 formed thereon, and the isolation dielectric region 2204 of LOCOS oxide film formed thereon. It also has the p-type channel stop layer 2203 in contact with the lower surface of the isolation dielectric region 2202. The p-type well region 2202 has the floating diffusion region 2205 (FD region for short hereinafter) of n-type diffusion layer formed therein, so that the photodiode (not shown) is formed and the pixel transistor is also formed which has the gate electrode 2206 formed with the gate insulation film 2207 placed thereunder.

The CMOS solid-state imaging device shown in FIG. 18 easily suffers from dark current because it has the gate electrode 2206 immediately above the depletion layer that occurs under the isolation dielectric region 2204 of LOCOS oxide film. In other words, that part where the FD region 2205 (which is a layer of $n^+$ in high concentration) and the channel stop layer 2203 (which is a layer of $p^+$) are close to each other is in such a state during signal reading that the FD region 2205 is given a voltage which is positive with respect to the p-type well region 2202. This implies that the pn junction is given a voltage in the reverse direction.

Moreover, FIG. 18 shows the region "b" in which the gate electrode 2206 of n⁺ polysilicon is formed with the isolation dielectric region 2204 placed thereunder. This gate electrode 2206 differs in work function from the p-type channel stop layer 2203 and hence the channel stop layer 2203 has its majority carrier substantially concentrated into p⁺ in proportion to the difference in work function even though the gate electrode 2206 is at the same potential as the p-type well region 2202. As the result, the depletion region 2208 between the FD region 2205 and the p-type well region 2202 becomes uneven such that the region "b" is shorter than the region "c" in which the gate electrode 2206 does not exist, as expressed by d1<d2. At the same time, a high electric field is applied across the FD region 2205 of n⁺ and the channel stop layer 2203 of p⁺ and this easily causes leakage current to occur. In other words, leakage current easily occurs if the material (electrode) placed near the depletion region is the one which substantially concentrates the majority carrier in the semiconductor region of opposite conduction type that forms the depletion layer by junction with the FD region.

To be more specific, leakage current easily occurs if the FD region is made of n-type silicon or aluminum which has such a work function as to substantially increase the concentration of the majority carrier in the hole region. Leakage current also easily occurs if the FD region is made of p-type silicon which has such a work function as to substantially increase the concentration of the majority carrier in the n region. In this case, therefore, it is desirable to make layout such that the depletion layer of the FD region comes least close to the p⁺ channel stop layer, as shown in FIG. 18.

Another example of CMOS solid-state imaging devices is shown in FIG. 19, cited from Japanese Patent Laid-open No. 2001-28433 which is hereinafter referred to as Patent Document 3. The CMOS solid-state imaging device shown in FIG. 19A includes the n-type semiconductor substrate 411, the p-type well region 412 formed thereon, the isolation dielectric region 413 of LOCOS oxide film formed thereon, the photodiode 414 of n-type semiconductor region, and the transistor 421 for read-out. The read-out transistor 421 leads the signal charge of the photodiode 414 to the vertical signal line. Moreover, it has the photodiode 414 and the n-type semiconductor region 415 as its source and drain, respectively, and also has the gate electrode 417 with the gate insulating film 416 placed thereunder. The p-type well region 412 has the p-type semiconductor region 422 therein which is so formed as to surround the isolation dielectric region 413.

SUMMARY OF THE INVENTION

The FD region has a region in which defects concentrate, and such a region is the field edge in which stress concentrates. When it overlaps with the depletion layer, the FD region increases in dark current. Even if the light shielding film is placed on the LOCOS oxide film (as shown in FIG. 17 cited from Patent Document 1) and the FD region is given a negative bias, the carrier in the p-well region becomes concentrated, the depletion layer becomes narrower, and the field intensity increases (as mentioned in Patent Document 2 and shown in FIG. 18). The depletion layer is the field edge where there exist defects. This leads to an increase in dark current, and dark current increases at an accelerated pace with increasing temperatures.

According to "A New Recombination Model for Device Simulation Including Tunneling," IEEE TED. Vol. 39, No. 2, pp. 331-338, 1992 Hurkx et al. and "Analysis of junction leakage in advanced germanium p⁺/n junctions," in proc. European Solid-state Device Research Conf. 2007, pp. 454-457 G. Eneman et al., semiconductor devices are generally subject to leakage current due to crystal defects, which is attributable to the mechanism called TAT (Trap-Assisted-Tunneling model), when the field intensity concentrates in crystal defects owing to the reverse bias applied to the pn junction. Therefore, it is well known that the foregoing problem arises from the TAT mechanism.

There is proposed in Patent Document 2 a layout that keeps the depletion layer least affected by the bias from the electrode through the oxide film. Unfortunately, this proposal is not effective in largely decreasing leakage current in the FD region because the depletion layer itself is the field edge where there exist defects.

This problem is tackled by forming the p-type semiconductor region 42 in the edge (so-called field edge) of the isolation dielectric region 413, thereby hole-pinning the field edge which is the defective layer, as shown in FIG. 19A cited from Patent Document 3. The result is that the depletion layer exposes itself from the surface but there are less defects in the field edge and hence dark current decreases. Unfortunately, since the p-type semiconductor region 422 for the hole pinning of the field edge is patterned by means of the resist mask 423, as shown in FIG. 19B, the isolation dielectric region 413 cannot be formed by the self-aligning method. Therefore, the depletion layer formed in the n-type semiconductor region 415 varies in area due to variation in the overlapping line width of the p-type semiconductor region 422 and the n-type semiconductor region 415. This would lead to a large fluctuation in dark current.

The present invention was completed in view of the foregoing. Thus, embodiments of the present invention to provide a solid-state imaging device which is characterized by a limited amount of leakage current in the floating diffusion region and a limited variation in leakage current among pixels. It is another object of the present invention to provide an electronic instrument, such as camera, equipped with the solid-state imaging device.

The solid-state imaging device according to an embodiment of the present invention includes a plurality of units each including a first semiconductor region of the first conduction type, a photoelectric conversion part having a second semiconductor region of the second conduction type which is formed in the region separated by the isolation dielectric region of the first semiconductor region, and pixel transistors formed in the first semiconductor region. Each unit also includes a floating diffusion region of the second conduction type which is formed in the region separated by the isolation dielectric region of the first semiconductor region and an electrode which is formed on the first semiconductor region existing between the floating diffusion region and the isolation dielectric region and which is given a prescribed bias voltage.

In the solid-state imaging device according to the embodiment of the present invention, each unit has an electrode which is formed on the first semiconductor region existing between the floating diffusion region and the isolation dielectric region, so that this electrode is given a prescribed bias voltage. This structure prevents the widening of the depletion layer formed in the floating diffusion region. The result is that the depletion layer existing on the surface of the semiconductor has a small surface area, which leads to reduction in leakage current.

The solid-state imaging device according to another embodiment of the present invention is produced by the process which consists of forming on a semiconductor substrate a first semiconductor region of the first conduction type, an isolation dielectric region, and a second semiconductor region of the second conduction type which has a higher impurity concentration than the first semiconductor region surrounding the isolation dielectric region. The process also includes a step of forming a photoelectric conversion part having a second semiconductor region of the second conduction type in the region demarcated by the isolation dielectric region and a step of forming the floating diffusion region of the second conduction type in the region. The process further includes a step of forming a pixel transistor having the gate electrode in the first semiconductor region. The process also includes a step of forming an electrode, to which a prescribed bias voltage is applied, in the first semiconductor region existing between the floating diffusion region and the isolation dielectric region.

The process for producing the solid-state imaging device according to the embodiment of the present invention includes a step of forming an electrode, to which a prescribed bias voltage is applied, in the first semiconductor region existing between the floating diffusion region and the isolation dielectric region. This process offers the advantage of preventing the widening of the depletion layer that occurs in the floating diffusion region, reducing the area of the depletion layer existing on the surface of the semiconductor, and reducing leakage current.

The solid-state imaging device according to yet another embodiment of the present invention includes a plurality of units each including a first semiconductor region of the first conduction type, a photoelectric conversion part having a second semiconductor region of the second conduction type which is formed in the region separated by the isolation dielectric region of the first semiconductor region, and pixel transistors formed in the first semiconductor region. Each unit also includes a floating diffusion region of the second conduction type which is formed in the region separated by the isolation dielectric region of the first semiconductor region and an insulating film having negative fixed charges which is formed on the first semiconductor region existing between the floating diffusion region and the isolation dielectric region.

The solid-state imaging device according to the embodiment of the present invention is characterized by the insulating film having negative fixed charges which is formed on the first semiconductor region existing between the floating diffusion region and the isolation dielectric region. This structure prevents the widening of the depletion layer that occurs in the floating diffusion region and hence makes small the area of the depletion layer existing on the surface of the semiconductor.

The solid-state imaging device according to yet another embodiment of the present invention is produced by the process which consists of forming on a semiconductor substrate a first semiconductor region of the first conduction type, an isolation dielectric region, and a second semiconductor region of the first conduction type which has a higher impurity concentration than the first semiconductor region surrounding the isolation dielectric region. The process also includes a step of forming a photoelectric conversion part having a second semiconductor region of the second conduction type in the region demarcated by the isolation dielectric region and a step of forming the floating diffusion region of the second conduction type in the region. The process further includes a step of forming pixel transistors having the gate electrode in the first semiconductor region. The process also includes a step of forming an insulating film with fixed negative charges on the first semiconductor region existing between the floating diffusion region and the isolation dielectric region.

The process for producing the solid-state imaging device according to the embodiment of the present invention includes a step of forming an insulating film with negative fixed charges on the first semiconductor region existing between the floating diffusion region and the isolation dielectric region. This process offers the advantage of preventing the widening of the depletion layer that occurs in the floating diffusion region, reducing the area of the depletion layer existing on the surface of the semiconductor, and reducing leakage current.

The electronic instrument according to yet another embodiment of the present invention includes a solid-state imaging device, an optical system to lead the incident light to the photodiode of the solid-state imaging device, and a signal processing circuit to process output signals from the solid-state imaging device. The solid-state imaging device is made up of the above-mentioned components.

That is, the solid state imaging device includes a plurality of units each including a first semiconductor region of the first conduction type, a photoelectric conversion part having a second semiconductor region of the second conduction type which is formed in the region separated by the isolation dielectric region of the first semiconductor region, and pixel transistors formed in the first semiconductor region. Each unit also includes a floating diffusion region of the second conduction type which is formed in the region separated by the isolation dielectric region of the first semiconductor region and an electrode which is formed on the first semiconductor region existing between the floating diffusion region and the isolation dielectric region and which is given a prescribed bias voltage.

Alternatively, each unit of the solid-state imaging device includes a first semiconductor region of the first conduction type, a photoelectric conversion part having a second semiconductor region of the second conduction type which is formed in the region separated by the isolation dielectric region of the first semiconductor region, and pixel transistors formed in the first semiconductor region. Each unit also includes a floating diffusion region of the second conduction type which is formed in the region separated by the isolation dielectric region of the first semiconductor region. Each unit further includes an insulating film with negative fixed charges which is formed on the first semiconductor region existing between the floating diffusion region and the isolation dielectric region.

The solid-state imaging device according to the present invention, which is incorporated into the electronic instrument, is characterized in that an electrode to which a prescribed bias voltage is applied or an insulating film with negative fixed charges is formed on the first semiconductor existing between the floating diffusion region and the isolation dielectric region. This structure prevents the widening of the depletion layer that occurs in the floating diffusion region and makes small the area of the depletion layer existing on the surface of the semiconductor.

The solid-state imaging device according to an embodiment of the present invention has the electrode to which a prescribed bias voltage is applied. This structure offers the advantage of making small the area of the depletion layer existing on the surface of the semiconductor, thereby reducing leakage current in the floating diffusion region and reducing variation in leakage current among pixels.

The process for producing the solid-state imaging device according to an embodiment of the present invention includes a step of forming the electrode to which a prescribed bias voltage is applied. This process yields the solid-state imaging device which has a little leakage current in the floating diffusion region and a small variation in leakage current among pixels.

The solid-state imaging device according to an embodiment of the present invention has the insulating film with negative fixed charges. This structure offers the advantage of making small the area of the depletion layer existing on the surface of the semiconductor, thereby reducing leakage current in the floating diffusion region and reducing variation in leakage current among pixels.

The process for producing the solid-state imaging device according to an embodiment of the present invention includes a step of forming the insulating film with negative fixed charges. This process yields the solid-state imaging device which has a little leakage current in the floating diffusion region and a small variation in leakage current among pixels.

The electronic instrument according to an embodiment of the present invention is equipped with the solid-state imaging device described above. It offers the advantage of reducing leakage current in the floating diffusion region and reducing variation in leakage current among pixels. Therefore, it is useful as a high-quality electronic instrument such as camera that produces high-quality images.

DETAILED DESCRIPTION OF THE PREFERRED EMBODIMENTS

The embodiments of the present invention will be described below in the following order.
1. Outline of the structure of the CMOS solid-state imaging device
2. The first embodiment (the structure of the solid-state imaging device and its production method)
3. The second embodiment (the structure of the solid-state imaging device)
4. The third embodiment (the structure of the solid-state imaging device)
5. The fourth embodiment (the structure of the solid-state imaging device)
6. The fifth embodiment (the structure of the solid-state imaging device)
7. The sixth embodiment (the structure of the electronic instrument)

1. Outline of the Structure of the CMOS Solid-State Imaging Device

Figure 1:
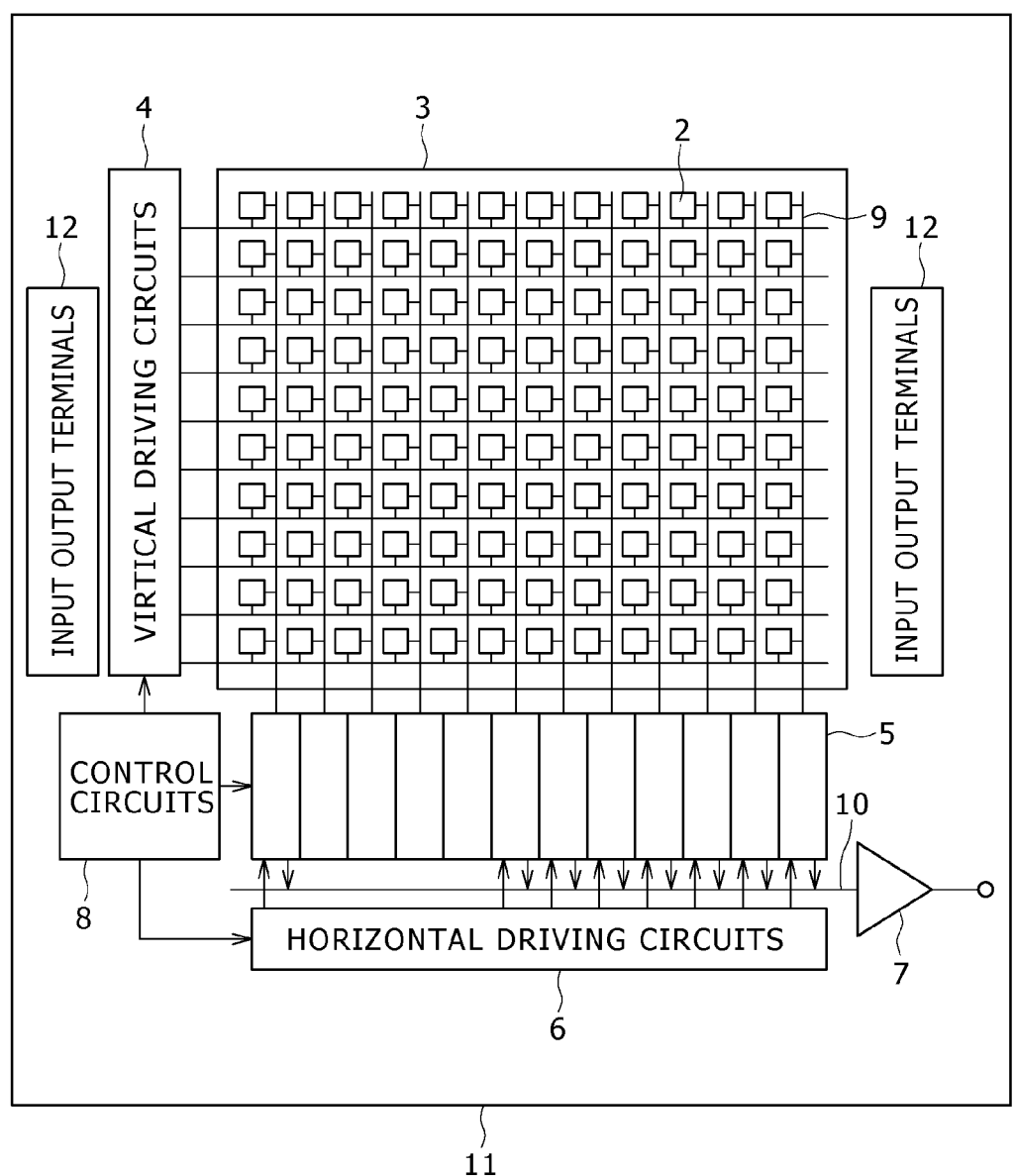
FIG. 1 is a schematic diagram illustrating one example of the solid-state imaging devices to be applied to the embodiments of the present invention.

FIG. 1 shows an outline of the structure of the CMOS solid-state imaging device for individual embodiments of the present invention. The solid-state imaging device 1 includes the semiconductor substrate 11 (such as silicon substrate), the pixel region 3 (or so-called imaging region), and the peripheral circuits. The pixel region 3 consists of a plurality of pixels 2 (each including a photoelectric conversion part) which are regularly arranged in a two-dimensional array. The pixel 2 has one photoelectric conversion part and a plurality of pixel transistors. Alternatively, the pixel 2 may be constructed such that a plurality of photoelectric conversion parts commonly own the pixel transistors (excluding transfer transistor). The pixel transistors include transfer transistor, reset transistor, amplifying transistor, and selecting transistor (with the last optionally omitted).

The peripheral circuits include the vertical driving circuit 4, the column signal processing circuit 5, the horizontal driving circuit 6, the output circuit 7, and the control circuit 8 (which are called logic circuits).

The control circuit 8 receives input clock signals and data that instructs the operation mode, and it also sends out such data as internal information of the solid-state imaging device. In other words, the control circuit 8 processes the vertical synchronizing signals, the horizontal synchronizing signals, and the master clock signals, thereby generating the clock signals and control signals that function as reference for the vertical driving circuit 4, the column signal processing circuit 5, and the horizontal driving circuit 6. These signals are entered into the vertical driving circuit 4, the column signal processing circuit 5, and the horizontal driving circuit 6.

The vertical driving circuit 4 is composed of shift transistors. It selects the pixel driving line and provides the selected pixel driving line with pulses to drive all the pixels in each row. In other words, the vertical driving circuit 4 selects and scans individual pixels 2 in the pixel region 3 sequentially in the vertical direction row by row. Then it causes the vertical signal lines 9 to send the pixel signals to the column signal processing circuit 5. The pixel signals are based on the signal charges proportional to the amount of light received by the photoelectric conversion element, such as photodiode, of each pixel 2.

The column signal processing circuits 5 are arranged for individual columns of the pixels 2. They process signals (to remove noise, for example) coming from the pixels 2 in one row, column by column. In other words, the column signal processing circuits 5 perform CDS (Correlated Double Sampling) (to remove fixed pattern noise peculiar to the pixels 2) and signal processing (such as signal amplification and AD conversion). It has the output stage in which the horizontal selecting switches (not shown) are connected to the horizontal signal line 10.

The horizontal driving circuit 6 is composed shift registers, so that it sends out horizontal scanning pulses sequentially, thereby selecting the column signal processing circuits 5 sequentially and allowing each of them to send out pixel signals to the horizontal signal line 10.

The output circuit 7 processes those signals which are sequentially supplied from each of the column signal processing circuits 5 through the horizontal signal line 10 and then sends out the processed signals. The signal processing includes buffering, black level adjustment, correction of variation among columns, and digital signal processing. The input output terminal 12 exchanges signals with external circuits.

2. The First Embodiment

Structure of the Solid-State Imaging Device

Figure 2:
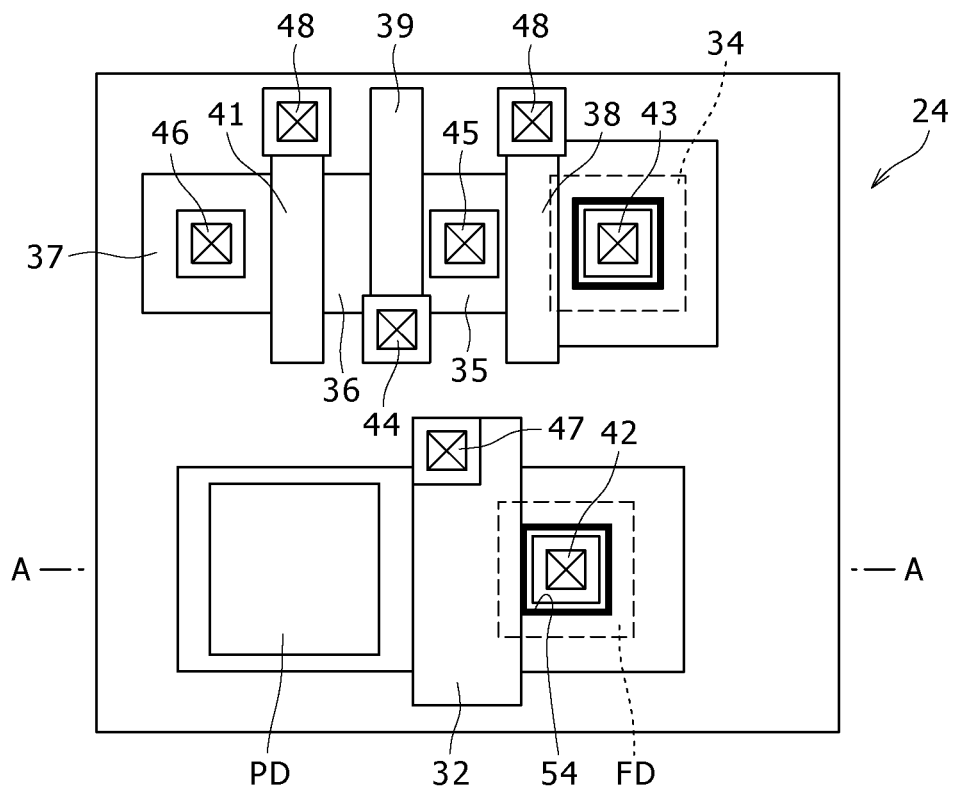
FIG. 2 is a schematic plan view illustrating the solid-state imaging device pertaining to the first embodiment of the present invention.
Figure 3:
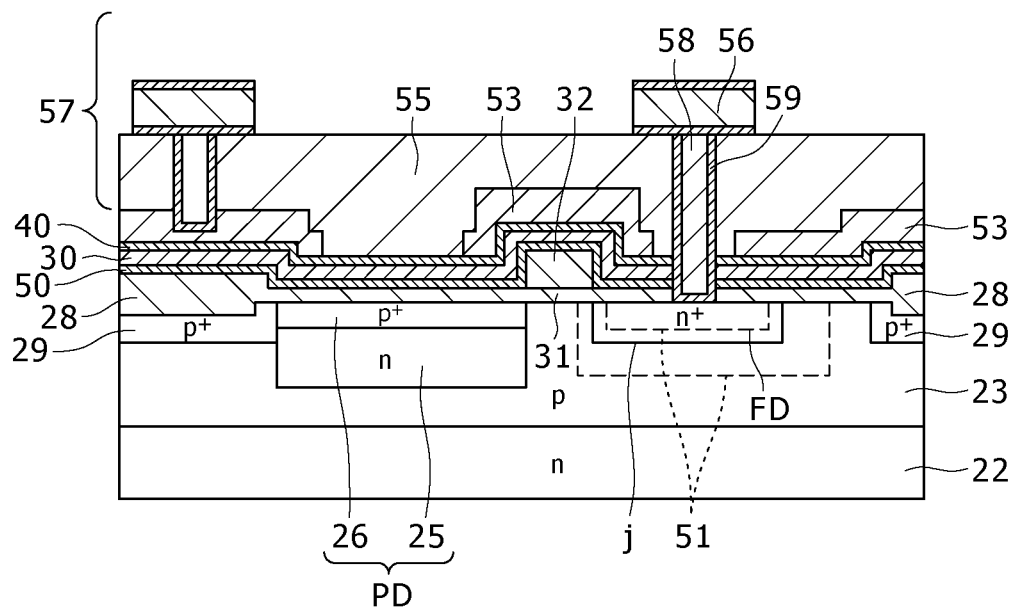
FIG. 3 is a schematic sectional view taken long the line A-A in FIG. 2.

FIGS. 2 and 3 show the solid-state imaging device or the CMOS solid-state imaging device pertaining to the first embodiment of the present invention. FIG. 2 is a schematic plan view (layout) of one section corresponding to a unit pixel of the imaging region in which a plurality of pixels are arranged in a two-dimensional array (or so-called matrix). FIG. 3 is a schematic sectional view taken along the line A-A in FIG. 2.

The solid-state imaging device 21 pertaining to the first embodiment includes the silicon semiconductor substrate 22 of the second conduction type, the semiconductor well region 23 of the first conduction type formed therein, and the pixel 24 formed therein, which includes the photodiode PD as the photoelectric conversion part and a plurality of pixel transistors. The imaging region is composed of a plurality of pixels 24 which are regularly arranged in a two-dimensional array (or matrix). According to this embodiment, the imaging region is constructed of a plurality of pixels 24 formed in the p-type semiconductor well 23 formed in the n-type semiconductor substrate 22.

The photodiode PD includes the n-type semiconductor region 25 and the p-type semiconductor region 26 placed thereon, the former performing photoelectric conversion and charge accumulation, and the latter suppressing dark current by virtue of its higher impurity concentration (with a high dose level) than the n-type semiconductor region. According to this embodiment, the pixel transistors include the transfer transistor Tr1, the reset transistor Tr2, the amplifying transistor Tr3, and the selecting transistor Tr4.

The p-type semiconductor well 23 has the isolation dielectric region 28 formed therein which is intended for interpixel separation and intrapixel separation. In this embodiment, the isolation dielectric region 28 is formed from an insulating film of STI structure or LOCOS oxide film. According to this embodiment, the isolation dielectric region 28 is an insulating film of LOCOS oxide film. The isolation dielectric region 28 is surrounded in the p-type semiconductor well region 23 by the p-type semiconductor region 29 having a higher impurity concentration (or a higher dose level) than the p-type semiconductor region 23.

The photodiode PD and the transfer transistor Tr1 are formed within the region demarcated by the isolation dielectric region 28. The remainder of the pixel transistors (which are the reset transistor Tr2, the amplifying transistor Tr3, and the selecting transistor Tr4) are collectively formed in the region separated away from the photodiode PD by the isolation dielectric region 28.

The transfer transistor Tr1 includes the photodiode PD which functions as the source, the floating diffusion region FD formed in the n-type semiconductor region which functions as the drain, and the transfer gate electrode 32 which has the gate insulating film 31 such as silicon film formed thereunder. The floating diffusion region FD has a higher impurity concentration (or a higher dose level) than the p-type semiconductor region 29 (surrounding the isolation dielectric region 28) and the p-type semiconductor well region 23. The floating diffusion region FD is formed by ion implantation ion implantation, preferably arsenic (As) with an n-type impurity.

The reset transistor Tr2 includes the n-type semiconductor region 34 as the source, the common n-type semiconductor region 35 as the drain, and the reset gate electrode 38 which has the gate insulating film 31 formed thereunder. The amplifying transistor Tr3 includes the common n-type semiconductor region 35 as the drain, the common n-type semiconductor region 36 as the source, and the amplifying gate electrode 39 which has the gate insulating film 31 formed thereunder. The selecting transistor Tr4 includes the common n-type semiconductor region 36 as the drain, the n-type semiconductor region 37 as the source, and the selecting gate electrode 41 which has the gate insulating film 31 formed thereunder. Each of the n-type semiconductor regions 34 to 37 is formed by the same process as the floating diffusion region. Each of the gate electrodes 32, 38, 39, and 41 is formed from polysilicon film doped with an impurity.

As mentioned later, the floating diffusion region FD is electrically connected to the n-type semiconductor region 34 which functions as the source of the reset transistor Tr2 and the amplifying gate electrode 39 through the contacts 42, 43, and 44. The common n-type semiconductor region 35 which functions as the drain of the reset transistor Tr2 and the amplifying transistor Tr3 is connected to the power source through the contact 45. The n-type semiconductor region 37 (which functions as the source of the selecting transistor Tr4) is connected to the vertical signal line through the contact 46.

The transfer transistor Tr1 has its transfer gate electrode 32 connected to the transfer line to which transfer gate pulses are applied through the contact 47. As the transfer transistor Tr1 becomes on, the signal charge of the photodiode PD is transferred to and held in the floating diffusion region FD. The reset transistor Tr2 has its reset gate electrode 38 connected to the reset line to which reset gate pulses are applied through the contact 48. The reset transistor Tr2 resets the signal charge which has been held in the floating diffusion region FE when it becomes on. The selecting transistor Tr4 has its selecting gate electrode 41 connected to the selecting line to which selecting gate pulses are applied through the contact 49. The selecting transistor Tr4 selects the columns when it becomes on, so that the pixel signals which result from charge-voltage conversion by the amplifying transistor Tr3 are sent to the vertical signal line.

According to this embodiment, the floating diffusion region FD is formed away from the isolation dielectric region 28 and the p-type semiconductor region 29 surrounding it. In addition, the floating diffusion region FD is formed such that the depletion layer 51 which holds therein the pn-junction "j" of the floating diffusion region FD does not overlap with the isolation dielectric region 28 and a portion of the depletion layer 51 exists on the surface of the semiconductor. It should be noted in FIG. 3 that the depletion layer 51 does not overlap with the isolation dielectric region 28 and the p-type semiconductor region 29 surrounding it and that the depletion layer 51 which extends toward the p-type semiconductor well region 23 and a portion of the depletion layer 51 which extends toward the floating diffusion FD expose themselves from the surface of the semiconductor.

The gate electrodes 32, 38, 39, and 42, and the surface of the semiconductor substrate which includes the isolation dielectric region 28 are covered with the silicon oxide film 50, the silicon nitride film 30, and the silicon oxide film 40. The remaining surface excluding the gate electrodes is entirely covered with the laminated insulating film composed of the gate insulating film 31 (such as silicon oxide film) mentioned above, the silicon nitride film 30, and the silicon oxide film 40. Moreover, the electrode 53 to which a prescribed DC bias voltage is applied is formed on the semiconductor substrate or on the laminated insulating film and between the floating diffusion region FD and the isolation dielectric region 28. In other words, the electrode 53 (to which a prescribed DC bias voltage is applied) is formed in the region where a portion of the depletion layer 51 exposes itself from the surface of the semiconductor. The prescribed bias voltage is so established as to increase the majority carrier density in the interface between the semiconductor well region 23 and the insulating film. According to this embodiment in which the semiconductor well region 23 is of p-type, the electrode 53 should preferably be given a negative voltage to induce holes (as the majority carriers) in the above-mentioned interface. Incidentally, as mentioned later, the foregoing effect may also be produced by application of 0 V to the electrode 53. The electrode 53 may be a film formed from metal such as tungsten (W), and it may serve also as a light shielding film. According to this embodiment, it is formed on the entire surface excluding the photodiode PD and the opening 54 for the contact.

There is a multilayered wiring layer 57 (composed of a plurality of wiring layers 56 separated by the interlayer insulating film 55), which is arranged above the surface of the substrate 23 on which are formed the photodiode FD and the pixel transistors Tr1 to Tr4. FIG. 2 shows only the first layer of the wiring 56. Each contact is connected to the wiring 56 through the conductive plug 58. The floating diffusion region FD is connected to the wiring 56 through the opening 54 of the electrode 53. Moreover, the electrode 53 is connected to the wiring 56 through the conductive plug 58 (See FIG. 3). The conductive plug 58 may be a tungsten plug separated by the barrier metal 59. The wiring 56 may be an aluminum wiring separated by the upper and lower barrier metal 59.

The multilayered wiring layer 57 is covered with a color filter and an on-chip lens (which are not shown), so that there is obtained the solid-state imaging device 21 of surface illuminating type as desired.

Figure 4:
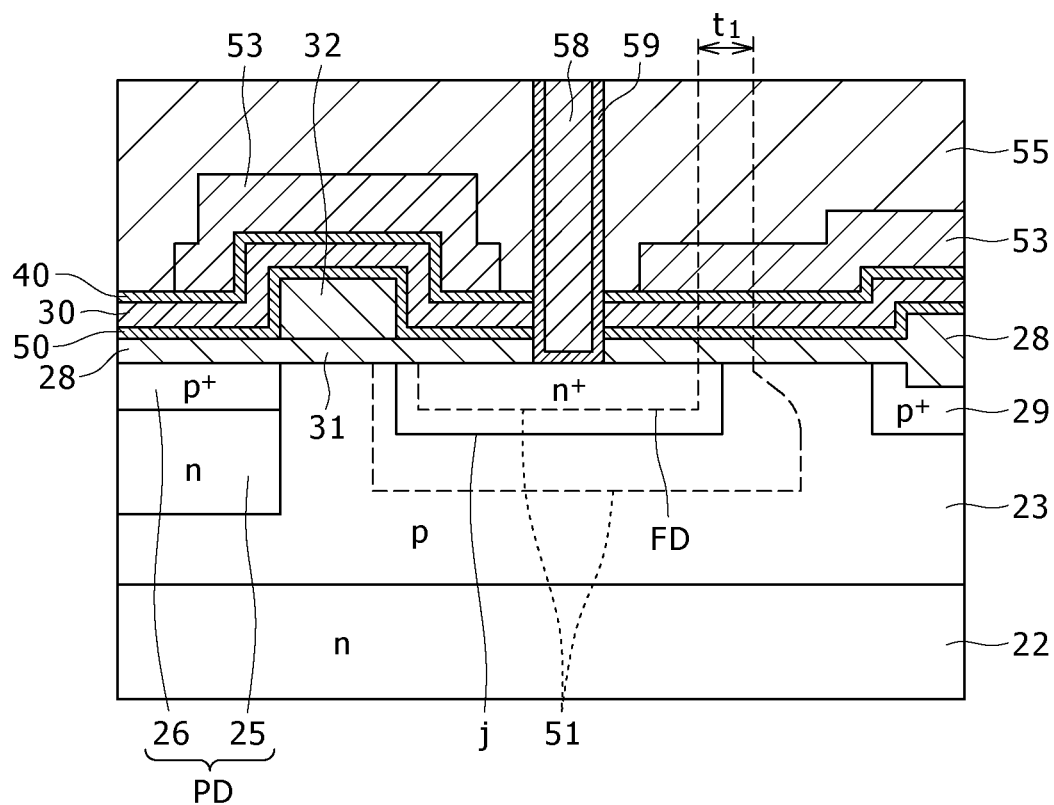
FIG. 4 is a sectional view that serves for description of the first embodiment
Figure 5:
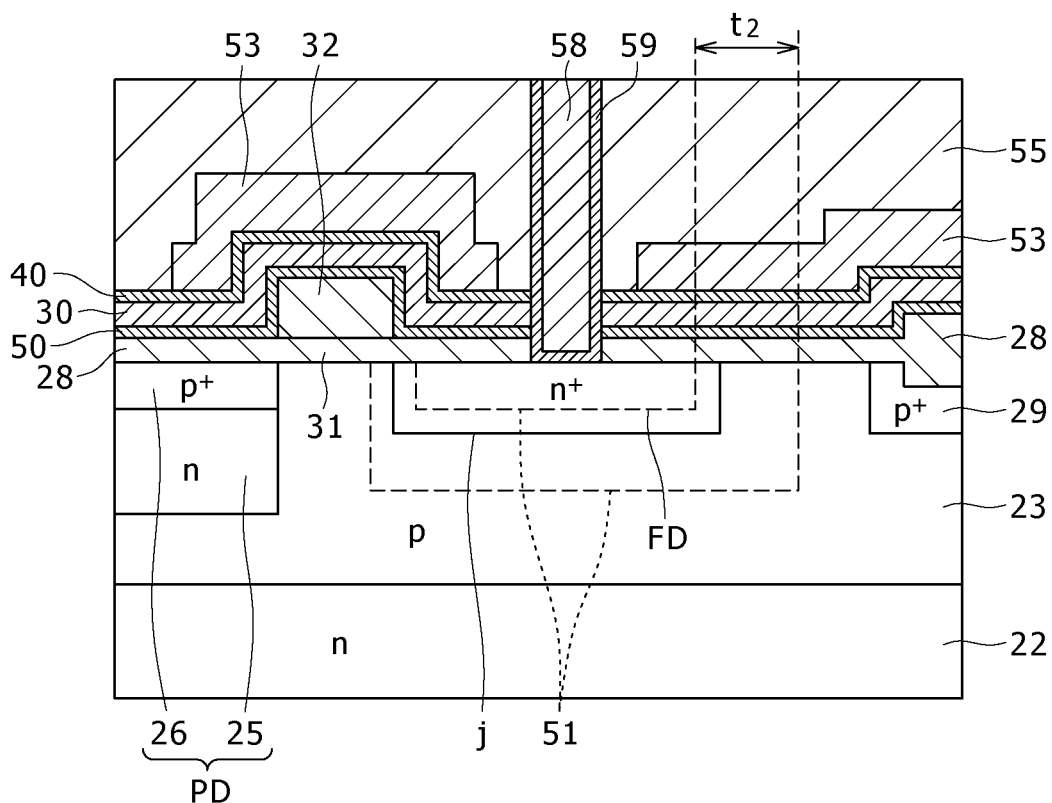
FIG. 5 is a comparative sectional view that serves for description of the first embodiment.

The solid-state imaging device 21 according to the first embodiment is constructed such that the electrode 53, to which a negative bias voltage is applied through the insulating film, is formed in the region where a portion of the depletion layer 51, which occurs on both sides of the pn junction "j" of the floating diffusion region, exposes itself from the surface of the semiconductor. This structure induces holes in the interface with the p-type semiconductor well region 23 so that the interface undergoes hole pinning. The result is a smaller spreading width of the depletion layer that exposes itself from the surface of the semiconductor at the side of the p-type semiconductor well region 23, as shown in FIG. 4. At the same time, the density of electrons tends to decrease in the side of the n-type semiconductor that becomes the floating diffusion region FD. However, the depletion layer that exposes itself from the surface of the semiconductor spreads less because the n-type semiconductor region which is the floating diffusion region FD is higher in impurity concentration than the p-type semiconductor well region 23. In other words, the n-type floating diffusion region FD generates so many electrons that it becomes less depleted even under the negative bias condition. For this reason, the depletion layer 51, which exposes itself from the surface of the semiconductor, has the width t1 (shown in FIG. 4) which is smaller than the spread width t2 (shown in FIG. 5) of the depletion layer 51 which occurs when the electrode 53 is kept at the ground voltage (0 V), and the depletion layer 51, which exposes itself from the surface of the semiconductor, has a smaller area. This leads to a reduction in leakage current (or so-called dark current) in the floating diffusion region FD and also leads to a reduction in variation of leakage current among pixels. The smaller the area of the depletion layer 51 that exposes itself from the surface of the semiconductor, the smaller the leakage current.

A problem arising from application of a negative bias is that the depletion layer decreases in area, resulting in an increase in the field intensity at the pn junction of the floating diffusion region FD. However, the surface of the semiconductor of the floating diffusion region FD is less subject to stress than the edge (or so-called field edge) of the isolation dielectric region 28 when the isolation dielectric region is formed. Moreover, since there is no step due to the isolation dielectric region 28 and the surface of the semiconductor is less affected by the film stress of the upper layer, the production process hardly gives rise to crystal defects. This suppresses the leakage current resulting from crystal defects due to TAT even though the field intensity increases because crystal defects occur infrequently. In addition, since the area of the depletion layer that exposes itself from the surface of the semiconductor depends on the bias voltage applied to the electrode 53, the depletion layer that exposes itself from the surface of the semiconductor between pixels has a constant area, and this results in the limited variation of leakage current among pixels.

Figure 6:
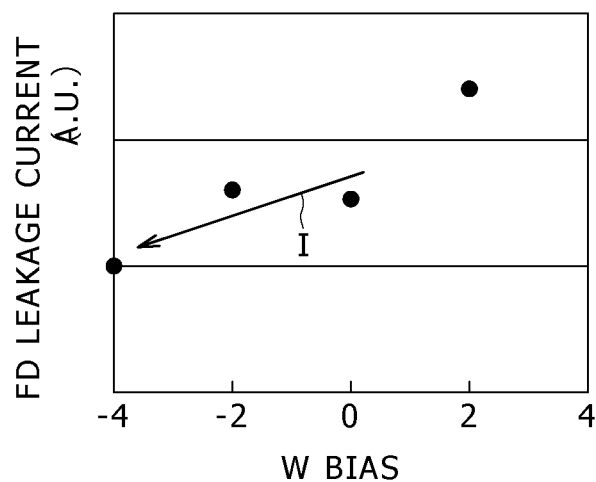
FIG. 6 is a graph that serves for description of the first embodiment, the graph showing the relation between the DC bias voltage and the leakage current in the floating diffusion region (FD)

FIG. 6 shows how the junction leakage current varies in the floating diffusion region FD when the bias voltage applied to the electrode 53 swings from plus to 0 V and further to minus. It is noted that the junction leakage current decreases as the negative bias increases, as indicated by the straight line I. It is also noted that the junction leakage current in the floating diffusion region FD decreases even at 0 V. It is apparent from FIG. 6 that the junction leakage current increases if the electrode 53 is absent, in which case there exist plus ions in the insulating film.

Figure 7A:
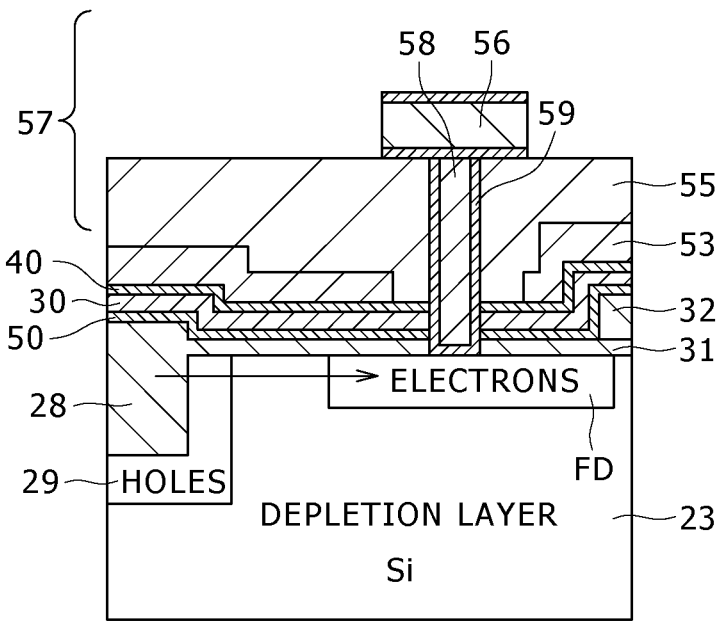
FIG. 7A is a sectional view of the sample.
Figure 7B:
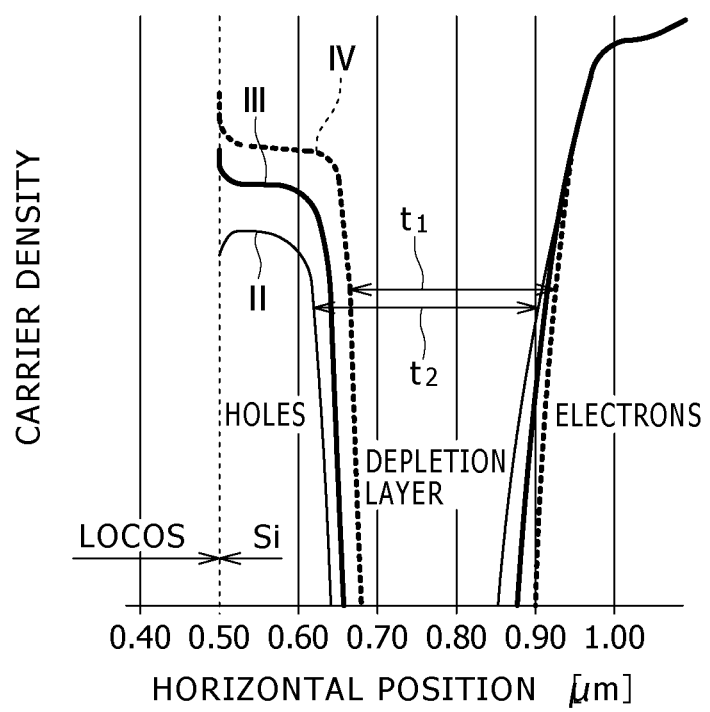
FIG. 7B is a graph showing how the distribution of carrier density depends on the bias voltage.

FIG. 7A shows how the distribution of carrier concentration varies in the uppermost surface of the floating diffusion region FD and the p-type well region 23 depending on the bias voltage applied to the electrode 53. The sample shown in FIG. 7A has constituents identical with those shown in FIG. 3, which are identified by the same symbols without repeated explanation. In FIG. 7B, the curve at the left represents the hole density (carrier density) in the p-type semiconductor region 29 surrounding the isolation dielectric region 28 of LOCOS oxide film, and the curve at the right represents the electron density (carrier density) in the floating diffusion region FD. The gap between the two curves corresponds to the depletion layer.

Moreover, in FIG. 7B, the curve II represents the distribution that occurs when the ground voltage (0 V) is applied to the electrode 53, the curve III represents the distribution that occurs when a negative bias voltage of −2 V is applied to the electrode 53, and the curve IV represents the distribution that occurs when a negative bias voltage of −4 V is applied to the electrode 53.

Application of a negative voltage causes accumulation to occur in the p-type semiconductor well region 23, thereby increasing the hole concentration in the surface depletion layer (as indicated by the curve IV) more than in the case where the ground voltage is applied (as indicated by the curve II). On the other hand, the electron density decreases negligibly small in the surface depletion layer because the impurity density (or the dose of impurity) is set high in the n-type floating diffusion region FD. Consequently, the width t1 of the depletion layer that occurs when a negative bias voltage is applied is smaller than the width t2 of the depletion layer that occurs when the ground voltage is applied, as shown in FIG. 7B. This leads to a decrease in the area of the depletion layer 51 that exposes itself from the surface of the semiconductors. Thus, this embodiment proved the effect of decreasing the leakage current in the floating diffusion region FD.

On the other hand, the hole pinning of the interface between the p-type semiconductor well region 23 and the insulating film suppresses the dark current in this interface. The fact that the n-type floating diffusion region FD with a high impurity concentration is away from the p-type semiconductor region 29 with a high impurity concentration, which surrounds the isolation dielectric region 28, keeps low the field intensity of the pn junction in the floating diffusion region FD and hence suppresses the leakage current in it. Moreover, the fact that the depletion layer 51 does not overlap with the isolation dielectric region 28 in which there exist crystal defects avoids the increase of leakage current.

The fact that the photodiode PD is covered with the laminated insulating film composed the silicon oxide film 31, the silicon nitride film 30, and the silicon oxide film 40 permits the incident light to enter the photodiode PD efficiently because the laminated insulating film prevents light reflection. In the case where the electrode 53 functions as the light-shielding film, there is no need to arrange the light-shielding film separately, and this simplifies the structure.

Example 1 of Production Process

Figure 8A:
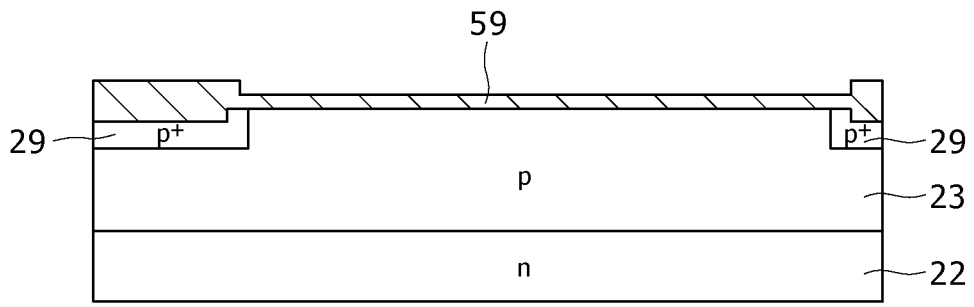
FIGS. 8A, 8B, and 8C are diagrams showing the first process (part 1) for producing the solid-state imaging device pertaining to the first embodiment.

Example 1 of the process for producing the solid-state imaging device according to the first embodiment is described below with reference to FIGS. 8 and 9. The process starts with getting ready the n-type silicon semiconductor substrate 22 as shown in FIG. 8A. This substrate 22 undergoes oxidation treatment so that its surface is coated with a silicon oxide film. The silicon oxide film is further coated with a silicon nitride film by CVD (Chemical Vapor Deposition) process. Subsequently, the silicon nitride film undergoes dry etching by lithography so that it has its specific part (where the isolation dielectric region is formed) selectively removed. This step is followed by field oxidation treatment to form the isolation dielectric region 28 with LOCOS oxide film. The n-type semiconductor substrate 22 undergoes sacrificed oxidation so that the sacrificed oxidation film 59 is formed on its surface. After that, p-type impurity, such as boron (B), is introduced by ion implantation, which is followed by heat treatment at 850° C., so that the p-type semiconductor well region 23 is formed. Before or after the isolation dielectric region 28 is formed, the p-type semiconductor region 29 which surrounds the isolation dielectric region 28 is formed.

Figure 8B:
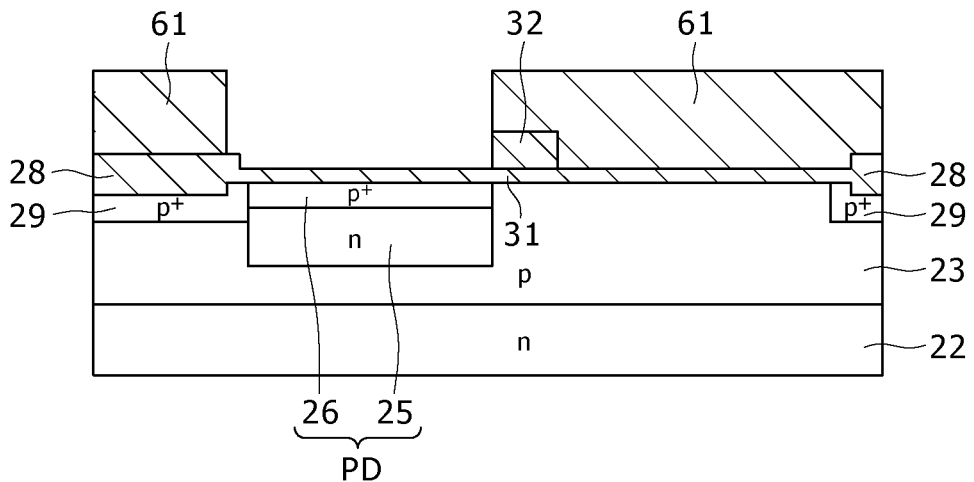

Next, the sacrificed oxidation film 59 is removed and the gate insulating film 31 is formed anew with a silicon oxide film by thermal oxidation, as shown in FIG. 8B. That part of the gate insulating film 31 on which the pixel transistor is formed is coated with a polysilicon film doped with p-type impurity. The polysilicon film undergoes patterning by lithography and dry etching, so that it forms the gate electrode of the pixel transistor. This patterning is performed in such a way that the gate electrode 31 is left on the active region. In other words, there are formed the transfer gate electrode 32, the reset gate electrode 38, the amplifying gate electrode 39, and the selecting gate electrode 41.

Next, the n-type semiconductor region 25 and the p-type semiconductor region 26 thereon are formed by ion implantation through the resist mask 61, so that the photodiode PD is formed. The n-type semiconductor region 25 is formed by ion implantation with n-type impurity, such as arsenic (As). The p-type semiconductor region 26 is formed by ion implantation with boron (B) into the vicinity of the surface.

Figure 8C:
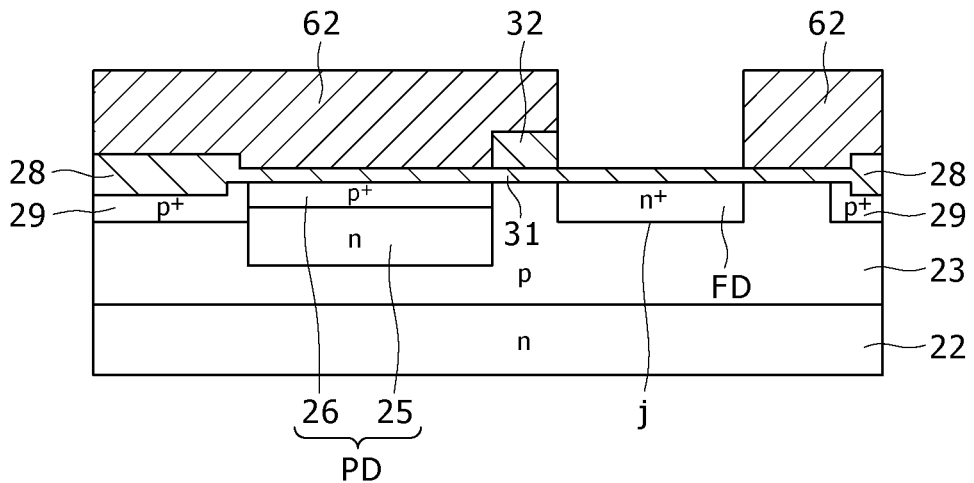

Next, the n-type semiconductor regions 34, 35, 36, and 37, which function as the source and drain of the pixel transistor (including the floating diffusion region FD), are formed through the resist mask 62, as shown in FIG. 8C. The floating diffusion region FD and the n-type semiconductor regions 34 to 37 should preferably be formed by ion implantation with arsenic (As). Arsenic (As) is desirable because it has a small diffusion coefficient and hence the impurity concentration changes sharply in the interface between the n-type semiconductor region and the p-type semiconductor well region.

The floating diffusion region FD is arranged such that the depletion layer spreading from its pn junction does not overlap with other parts of the isolation dielectric region 28. In other words, it is formed a certain distance away from the isolation dielectric region 38 and the p-type semiconductor region 29 surrounding it.

The p-type semiconductor region 29 surrounding the isolation dielectric region 28 is formed such that it has a higher impurity concentration than the p-type semiconductor well region. The floating diffusion region FD is formed such that it has a higher impurity concentration than the p-type semiconductor region 29 and the p-type semiconductor well region 23. The floating diffusion region FD should preferably have an impurity concentration which satisfies the condition that even when a negative bias voltage is applied to the electrode 53 mentioned above it is not affected by the hole concentration induced in the surface and it suppresses the spreading width of the depletion layer and also suppresses the junction leakage current and it permits sufficient contact with the floating diffusion region FD.

The p-type semiconductor well region 23 may have an impurity concentration (in terms of dose) of about $1 \times 10^{12}$ to $1 \times 10^{12}/cm^3$. The p-type semiconductor region 29 surrounding the isolation dielectric region may have an impurity concentration (in terms of dose) of $1 \times 10^{13}$ to $1 \times 10^{14}/cm^3$.

Each of the n-type semiconductor region and p-type semiconductor region, which function as the source and drain respectively, of the n-channel MOS transistor and p-channel MOS transistor in the imaging region and peripheral circuits has the high-concentration region and low-concentration region of LDD structure, which are not shown.

Figure 9D:
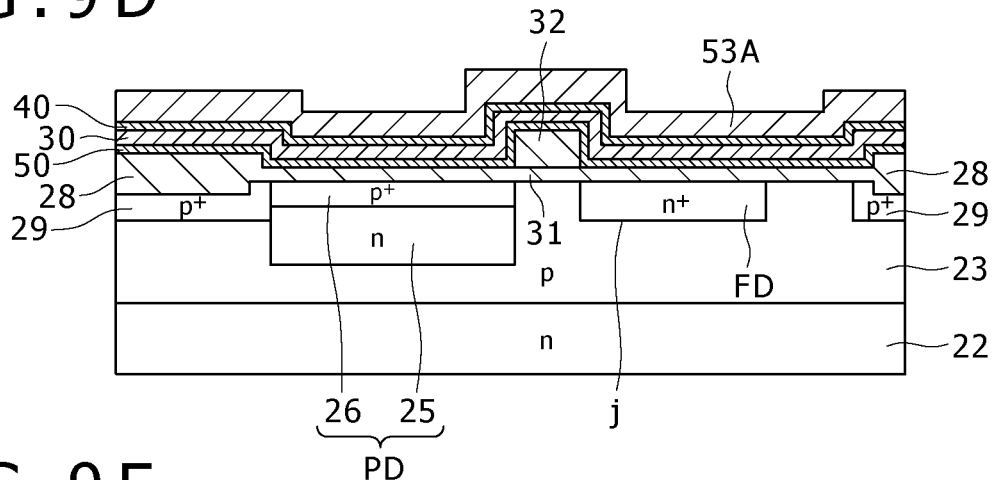
FIGS. 9D, 9E, and 9F are diagrams showing the first process (part 2) for producing the solid-state imaging device pertaining to the first embodiment.

In the next step shown in FIG. 9D, the entire surface including the gate electrode 32 and the gate electrodes 38, 39, and 41 (which are not shown) is covered with the laminated insulating film composed of the silicon oxide film 50, the silicon nitride film 30, and the silicon oxide film 40. The silicon oxide films 50 and 40 may be TEOS film. The insulting film is coated with the metal film 53A of high-melting metal such as tungsten (W) or any other metal, which becomes the electrode 53 later. This metal film functions as the light-shielding film in the case of a solid-state imaging device that needs light-shielding properties. The laminated insulating film of silicon oxide film 50, silicon nitride film 30, and silicon oxide film 40 function as the anti-reflecting film. The insulating film should have a total thickness of about 10 to 250 nm.

Figure 9E:
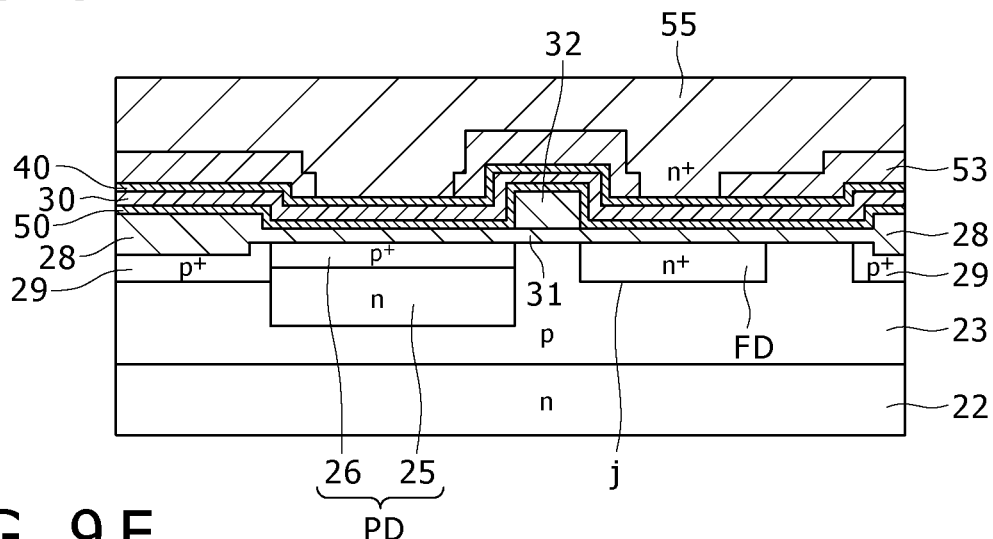

In the next step shown in FIG. 9E, the metal film 53A undergoes patterning to make openings corresponding to the regions for the photodiode PD, the contact for the gate electrode, and the contact for the n-type semiconductor regions that becomes the source and drain. Patterning is accomplished to form the electrode 53 in such a way that the metal film 53A stretches over the floating diffusion region FD and the p-type semiconductor well region 23 and completely covers the depletion layer that exposes itself from the surface of the semiconductor.

Figure 9F:
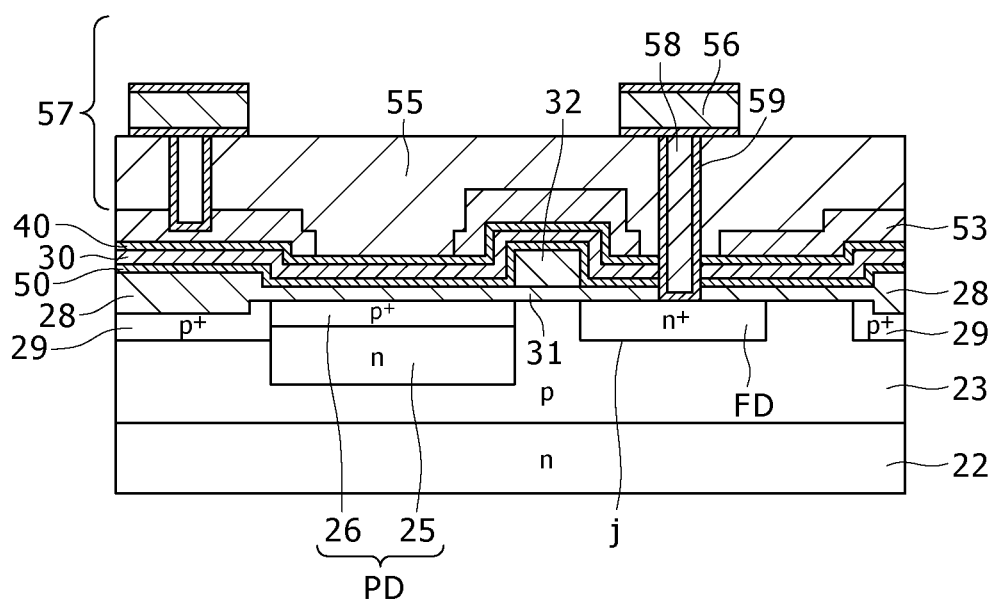

In the next step shown in FIG. 9F, the interlayer insulating film 55 is deposited, followed by planarizing by CMP (Chemical Mechanical Polishing). After that, the opening for the contact is formed. The opening has its inside coated with the barrier metal 59 of high-melting metal, such as titanium (Ti), or TiN. Then, the opening is filled with tungsten (W) by CVD. The deposited tungsten (W) undergoes etchback or CMP to form the conductive plug 58.

In the next step, the interlayer insulating film 55 is coated with the barrier metal 59 of TiN, aluminum, and the barrier metal 59 (which are sequentially deposited), followed by patterning to form the wiring 56 of aluminum. This step is repeated to form the wiring 56 in multiple layers. In this way the multilayered wiring is completed.

In the next step (not shown), each multilayered wiring is provided with a color filter and an on-chip lens, which are sequentially formed with a planarizing film placed thereunder. In this way there is obtained the solid-state imaging device 21.

Example 2 of Production Process

Figure 10A:
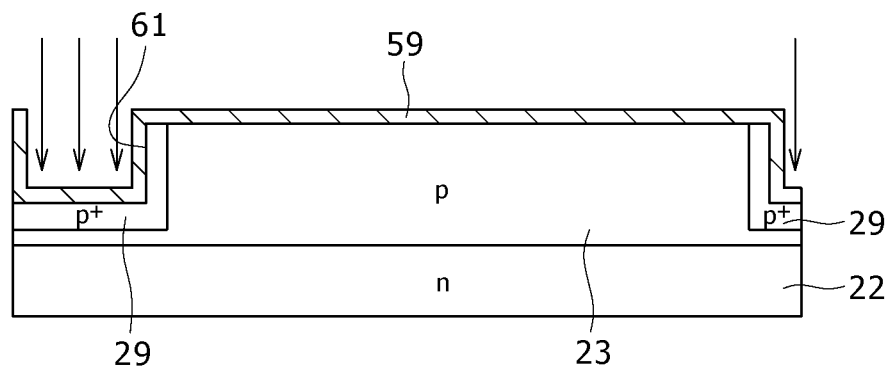
FIGS. 10A and 10B are diagrams showing the second process for producing the solid-state imaging device pertaining to the first embodiment.

Example 2 of the process for producing the solid-state imaging device according to the second embodiment is described below with reference to FIG. 10. The second embodiment employs the isolation dielectric region 28 of STI (Shallow Trench Isolation) structure.

The first step starts with fabricating the n-type silicon semiconductor substrate 22 to form therein the p-type semiconductor well region 23, which is subsequently etched to form the groove 61 with a prescribed depth in the region where the isolation dielectric region is to be formed. The groove 61 has its inside wall coated with the silicon oxide film 62. The groove 61 is surrounded by the p-type semiconductor region 29 which is formed by selective ion implantation with p-type impurity, such as boron (B), through its inside into the p-type semiconductor well region 23. The p-type semiconductor well region 23 has its surface coated with the sacrificed oxidation film 59.

Figure 10B:
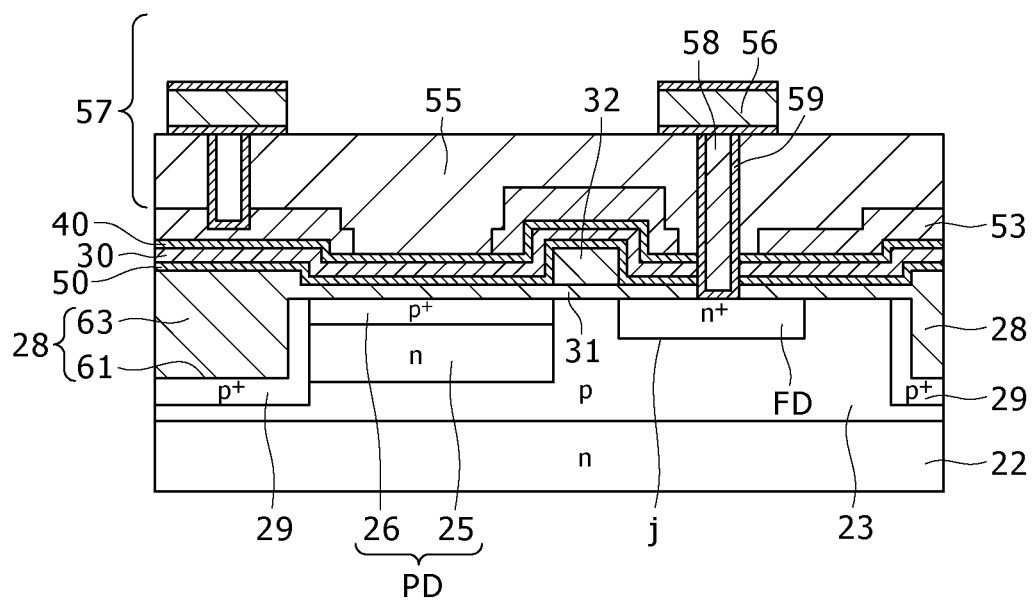

In the next step shown in FIG. 10B, the groove 61 is filled with the silicon oxide film 63, so that the isolation dielectric region 28 of STI structure is formed. This step is followed by the same steps as shown in FIGS. 8B to 9F. The floating diffusion region FD is formed away from the p-type semiconductor region 29 so that they do not overlap with each other. The p-type semiconductor region 28 may be formed after the isolation dielectric region 28 of STI structure has been formed. Other steps are carried out in the same way as mentioned above (Example 1), and hence their detailed description is omitted.

The above-mentioned examples 1 and 2 of the production method demonstrate the production of the solid-state imaging device 21 pertaining to the first embodiment which has limited leakage current in the floating diffusion region and also has limited variation in the leakage current among pixels.

3. The Second Embodiment

Structure of the Solid-State Imaging Device

Figure 11:
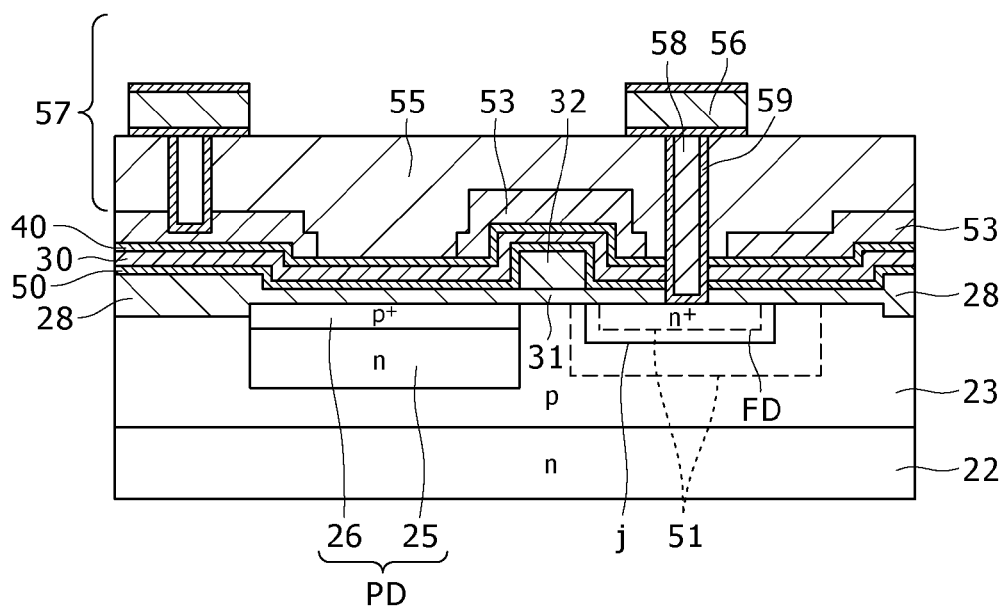
FIG. 11 is a schematic sectional view illustrating the solid-state imaging device pertaining to the second embodiment of the present invention.

FIG. 11 shows the solid-state imaging device according to an embodiment of the present invention or the CMOS solid-state imaging device pertaining to the second embodiment of the present invention. This embodiment is applicable to the solid-state imaging device capable of global shutter action. The solid-state imaging device 71 pertaining to the second embodiment is identical in its basic structure with the solid-state imaging device 21 pertaining to the first embodiment. Therefore, those parts shown in FIG. 11 which are common to those parts shown in FIG. 3 are given the same symbols, and their description is not repeated.

The solid-state imaging device 71 pertaining to this embodiment is constructed such that the signal charge from the photodiode PD is transferred to the floating diffusion region FD simultaneously for all the pixels, and the signal charges are held in the floating diffusion region FD for a prescribed period of time. In other words, the solid-state imaging device 71 is constructed such that the signal charges (for all pixels) accumulated in the photodiodes PD are transferred to their corresponding floating diffusion regions FD to be held there, and then the signal charges of pixels in each row are sequentially converted into charge voltage and sent out. That is to say, the floating diffusion region FD has the memory function and holds the charges.

The solid-state imaging device 71 works according to the drive timing chart as shown in FIG. 71. At first, it turns on the transistors Tr1 for all the pixels and the reset transistor Tr2 so as to reset charges in the photodiode PD. In other words, it sends the transfer pulses TGi and TGi+1 to the transfer gate electrode and sends the reset gate pulses RSTi and RSTi+1 to the reset gate electrode. Subsequently, it starts exposure and accumulates charges in the photodiode PD.

Next, the solid-state imaging device 71 resets the floating diffusion region FD for all the pixels and then transfers the signal charges from the photodiodes PD to the floating diffusion region FD. In other words, it sends the reset gate pulses RSTi and RSTi+1 to turn on the reset transistor Tr2 and reset the floating diffusion region FD. The period A corresponds to the duration of exposure common to all the pixels.

The electrode 53 continues to be impressed with a negative bias voltage. However, it is impressed with the ground voltage or a positive bias voltage for reliable charge transfer only when the signal charge is transferred from the photodiodes PD to the floating diffusion region FD. After the completion of transfer of signal charges, the voltage Vw of the electrode 53 is returned to that in the state of negative bias simultaneously with the transfer gate voltage TGi and TGi+1, and the electrode 53 is made into the state of negative bias while the floating diffusion region FD holds charges. In other words, the transfer gate electrode TGi and TGi+1 become the state of negative bias. The period Bi corresponds to the period in which charges for the ith row are held and the period Bi+1 corresponds to the period in which charges for the (i+1)th row are held.

The signal charges held in the floating diffusion region FD apply the selecting gate pulses SELi and SELi+1 to the selecting gate electrode and turn on the selecting transistor Tr4, thereby reading the pixels row by row. In this case, the charge holding period of the floating diffusion region FD extends by the period necessary for reading the ith row while shifting from the ith row to the (i+1)th row. Consequently, the charge holding period becomes longer as reading proceeds to the later rows. The floating diffusion region FD should ideally keep the potential VFD constant during the charge holding period. In actual, however, the potential gradually decreases, owing to an increase in leakage current, as the holding period extends, as indicated by the broken line.

Figure 12:
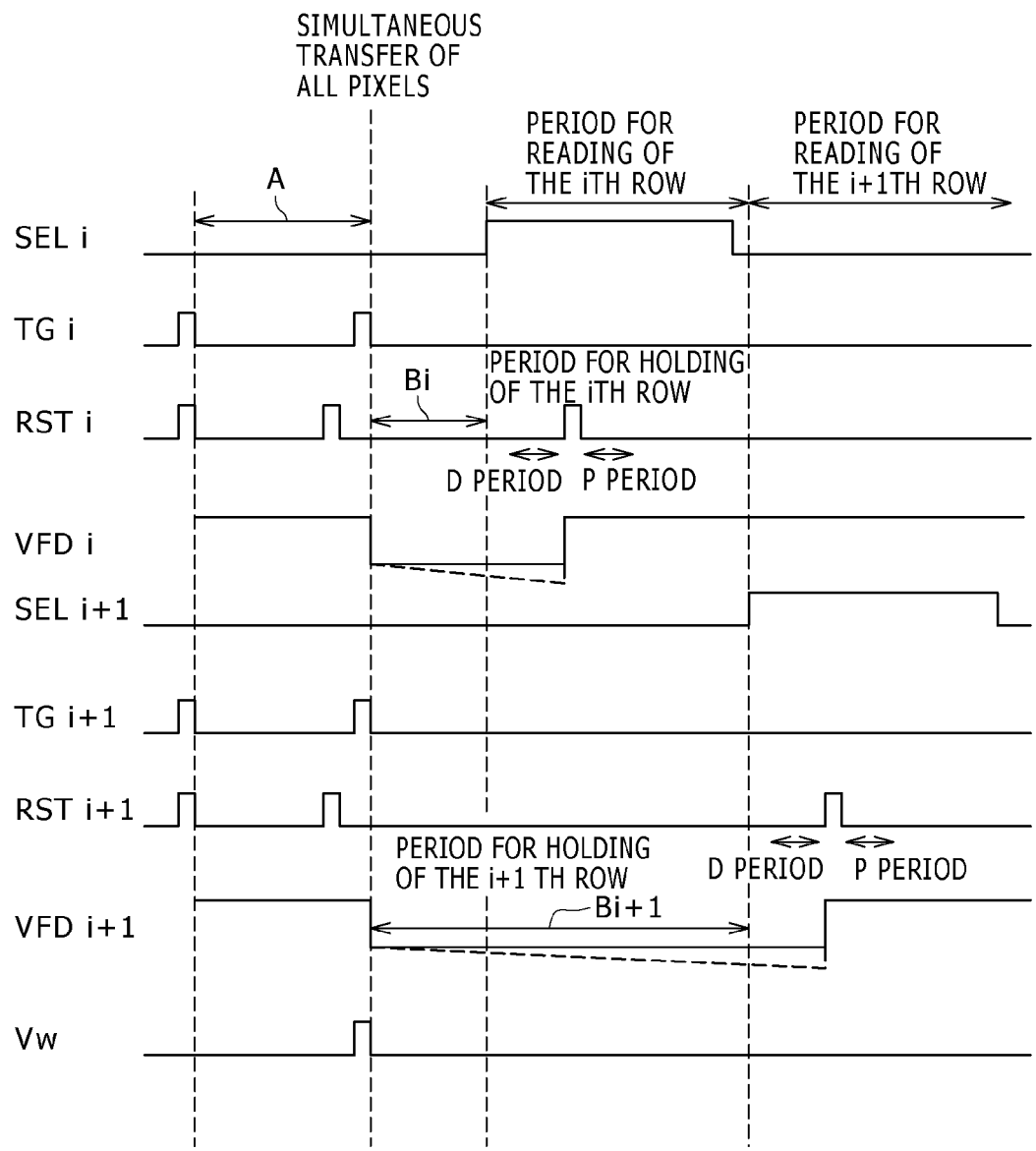
FIG. 12 is a timing chart to drive the solid-state imaging device pertaining to the second embodiment.

Incidentally, in FIG. 12, the D period corresponds to the period in which charges are accumulated in the floating diffusion region FD, and the P period corresponds to the period in which no charges exist in the floating diffusion region FD.

The solid-state imaging device 71 pertaining to the second embodiment offers the advantage of reducing leakage current while signal charges are being held in the floating diffusion region FD and also reducing variation of leakage current among pixels. It also produces the same effect as that in the first embodiment.

4. The Third Embodiment

Structure of the Solid-State Imaging Device

Figure 13:
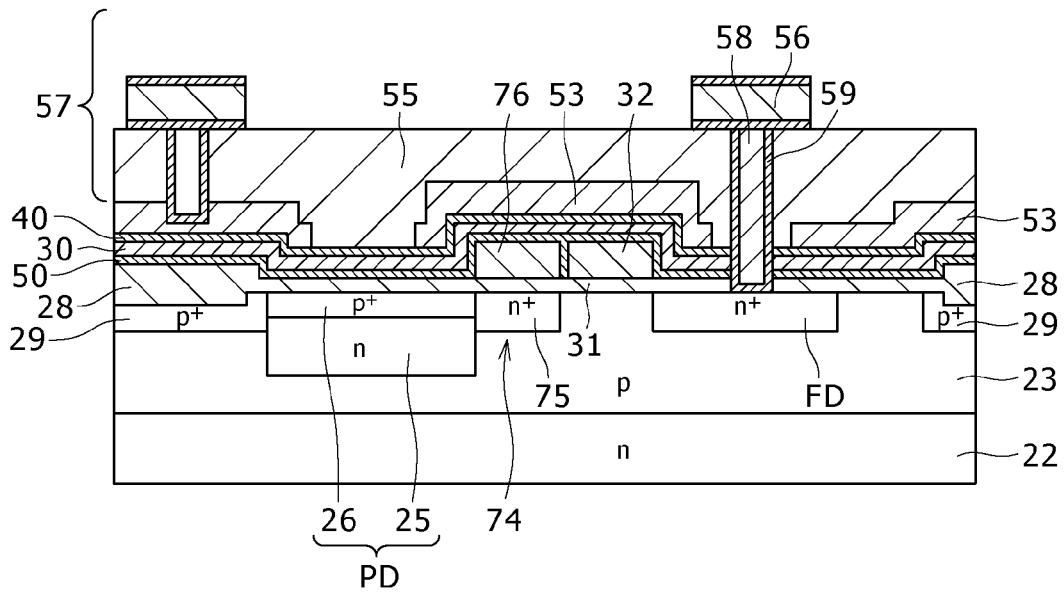
FIG. 13 is a schematic sectional view showing important parts of the solid-state imaging device pertaining to the third embodiment of the present invention.

FIG. 13 shows the solid-state imaging device according to an embodiment of the present invention or the CMOS solid-state imaging device pertaining to the third embodiment of the present invention. This embodiment is applicable to the solid-state imaging device capable of global shutter action. The solid-state imaging device 71 pertaining to the third embodiment has, between the photodiode PD and the floating diffusion region FD, the charge holding part (so-called memory part) 74 which temporarily holds the signal charges from the photodiode PD. The charge holding part 74 is adjacent to the photodiode PD and is composed of the n-type semiconductor region 75, which is formed in the p-type semiconductor well region 23, and the gate electrode 76 formed thereon with the gate insulating film 31 interposed between them. The n-type semiconductor region 74 may be formed in the same way as the n-type semiconductor region, which becomes the floating diffusion region FD, is formed. On the surface of the p-type semiconductor well region 23 between the charge holding part 75 and the floating diffusion region FD is formed the gate electrode 32 with the gate insulating film 31 placed thereunder. The electrode 53 is so formed as to cover also the gate electrode 76 of the charge holding part and the transfer gate electrode 32.

The solid-state imaging device 71 is identical in its structure with the solid-state imaging device 21 pertaining to the first embodiment. Therefore, those parts shown in FIG. 13 which are common to those parts shown in FIG. 3 are given the same symbols, and their description is not repeated.

The solid-state imaging device 71 pertaining to the third embodiment may be produced in the same way as shown in Examples 1 and 2 of the production method in the first embodiment mentioned above. According to this production method, the n-type semiconductor region 75 of the charge holding part 74 is formed by the same step as used for the floating diffusion region FD and other n-type semiconductor regions which become the source and drain.

The solid-state imaging device 71 pertaining to the third embodiment works in such a way that all the pixels are exposed for a uniform period and then the gate electrode 76 of the charge holding part 74 is given reading gate pulses so that the signal charges of the photodiodes PD of all the pixels are temporarily read out to the n-type semiconductor region 75 of the charge holding part 74 and held there. After that, the transfer gate electrode is given transfer gate pulses as usual, so that the signal charges held in the charge holding part 74 row by row for all the pixels are transferred to the floating diffusion region FD and the selecting transistor is turned on and the pixel signals are read out. The timing chart is identical with that shown in FIG. 12 except for the timing for transfer gate pulses and except that the reading gate pulses to be applied to the gate electrode 76 of the charge holding part 74 are replaced by the gate pulses shown in FIG. 12.

The solid-state imaging device 71 pertaining to the third embodiment offers the advantage of reducing leakage current in the floating diffusion region FD and also reducing leakage current among pixels on account of application of a negative bias to the electrode 53. Another advantage is that the leakage current of the charge holding part 74 is controlled by the bias voltage of the gate electrode 73. It also produces the same effect as that in the first embodiment.

5. The Fourth Embodiment

Structure of the Solid-State Imaging Device

Figure 14:
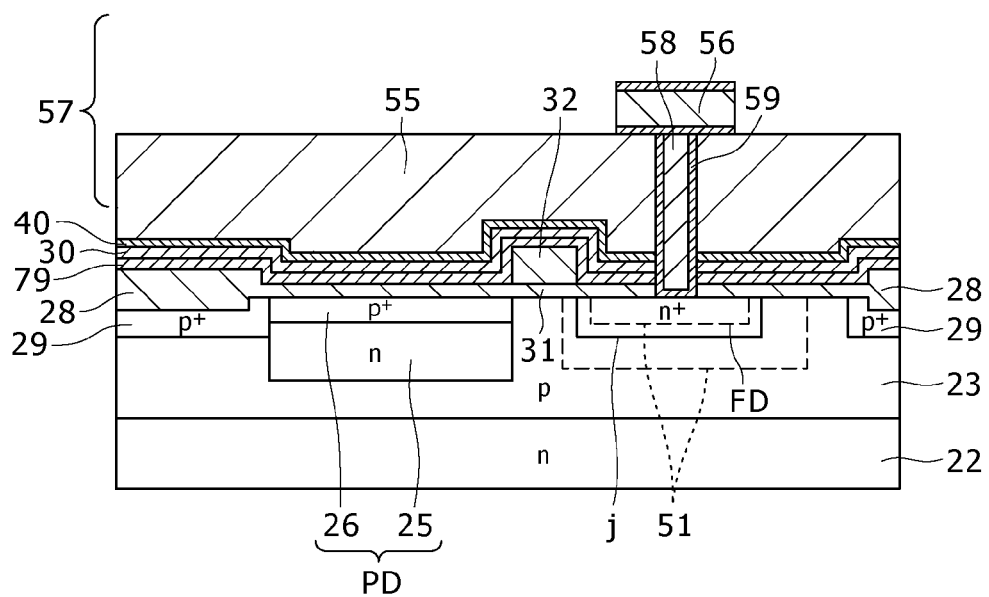
FIG. 14 is a schematic sectional view showing important parts of the solid-state imaging device pertaining to the fourth embodiment of the present invention.

FIG. 14 shows the solid-state imaging device according to an embodiment of the present invention or the CMOS solid-state imaging device pertaining to the fourth embodiment of the present invention. The solid-state imaging device 78 pertaining to this embodiment does not have the electrode 53 to which the negative bias voltage is applied but has the insulating film 79 with negative fixed charges which covers entirely the photodiode PD and the floating diffusion region FD. This insulating film 79 is coated with the silicon nitride film 30 and the silicon oxide film 40 sequentially formed thereon. The insulating film 79 with negative fixed charges should have a thickness, say about 3 nm to 100 nm, which is enough for holes to accumulate (to increase the hole concentration) on the p-type semiconductor well region 23.

The insulating film 79 with negative fixed charges may be formed from any of hafnium dioxide ($HfO_2$), aluminum oxide ($Al_2O_3$), tantalum oxide ($Ta_2O_5$), lanthanum oxide ($La_2O_3$), and yttrium oxide ($Y_2O_3$). The insulating film 79 may also be formed from oxide of any of Zn, Pr, Nd, Pm, Sm, Eu, Gd, Tb, Dy, Ho, Er, Tm, Yb, Lu, and Ti. The insulating film 79 may be formed by ALD (Atomic Layer Deposition) method or MOCVD (Metal Organic Chemical Vapor Deposition) method.

The solid-state imaging device 78 is identical in structure with the solid-state imaging device 21 pertaining to the first embodiment mentioned above. Those parts shown in FIG. 14 which are common to those parts shown in FIG. 3 are given the same symbols, and their description is not repeated.

The solid-state imaging device 78 pertaining to the fourth embodiment may be produced in the same way up to the steps shown in FIGS. 8A to 8C. After these steps, the entire surface is coated with the insulating film 79 having negative fixed charges, the silicon nitride film 30, and the silicon oxide film 40 which are arranged one over another. Subsequently, the interlayer insulating film, the conductive plug, and the wiring are formed. This step is repeated to form the multiple wiring layer, which is provided with a color filter and an on-chip lens, with a planarizing film placed thereunder. In this way there is obtained the solid-state imaging device 78.

The solid-state imaging device 79 pertaining to the fourth embodiment offers the advantage of increasing the hole concentration in the surface of the p-type semiconductor well region 23 owing to the insulating film 79 with negative fixed charges, thereby allowing hole pinning to occur in that surface. This lowers the electron density in the surface of the n-type semiconductor region of the floating diffusion region FD and prevents the n-type semiconductor region from becoming depleted because the impurity concentration in the n-type semiconductor region is higher than the p-type semiconductor well region 23. The resulting state is equivalent to that in which the negative bias is applied to the electrode 53, and this reduces leakage current (dark current) in the floating diffusion region FD and also reduces variation in leakage current among pixels.

The insulating film 78 with negative fixed charges (mentioned in the fourth embodiment) may have the same structure as that shown in FIGS. 11 and 13 which permits the above-mentioned global shutter action.

6. The Fifth Embodiment

Structure of the Solid-State Imaging Device

Figure 15:
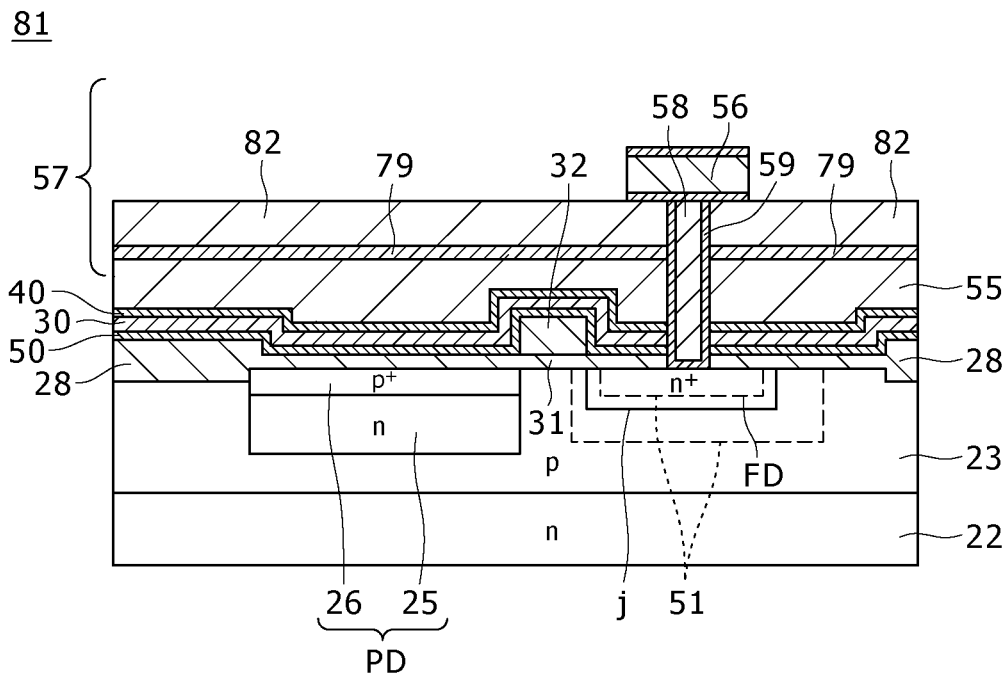
FIG. 15 is a schematic sectional view showing important parts of the solid-state imaging device pertaining to the fifth embodiment of the present invention.

FIG. 15 shows the solid-state imaging device according to an embodiment of the present invention or the CMOS solid-state imaging device pertaining to the fifth embodiment of the present invention. The solid-state imaging device 81 pertaining to this embodiment has the insulating film 79 with negative fixed charge which is uniformly formed on the laminated insulating film (which is composed of the silicon oxide film 50, the silicon nitride film 30, and the silicon oxide film 40) with the interlayer insulating film 50 interposed between them. It is identical in its structure, except for the foregoing, with the one pertaining to the fourth embodiment. Therefore, those parts shown in FIG. 15 which are common to those parts shown in FIG. 14 are given the same symbols, and their description is not repeated.

The solid-state imaging device 81 pertaining to the fifth embodiment may be produced in substantially the same way as the solid-state imaging device 78 pertaining to the fourth embodiment except that the step of forming the insulating film 79 with negative fixed charges is carried out after the step of formation in the fourth embodiment.

The solid-state imaging device 81 pertaining to the fifth embodiment, which has the insulating film 79 with negative fixed charges in place of the electrode 53 to which a negative bias voltage is applied, produces the same effect as in the fourth embodiment. The effect is a reduced leakage current (dark current) in the floating diffusion region FD and a reduced variation in leakage current among pixels.

The insulating film 78 with negative fixed charges (mentioned in the fifth embodiment) may have the same structure as that shown in FIGS. 11 and 13 which permits the above-mentioned global shutter action.

In the solid-state imaging device pertaining to the foregoing embodiments, each unit pixel may be composed discretely of one photodiode and a plurality of transistors, say four transistors or three transistors; alternatively it may be composed jointly of a plurality of photodiodes, one floating diffusion region FD, and one pixel transistor.

The solid-state imaging device pertaining to the foregoing embodiments is constructed such that the signal charges are electrons, the first conduction type is p type, and the second conduction type is n type. However, this structure may also be applied to the solid-state imaging device in which the signal charges are positive (or holes). In this case, the first conduction type is n type and the second conduction type is p type.

7. The Sixth Embodiment

Structure of the Electronic Instrument

The above-mentioned solid-state imaging device according to an embodiment of the present invention may be incorporated into various electronic instruments including camera systems (such as digital still and video cameras) and portable telephones with imaging capability.

Figure 16:
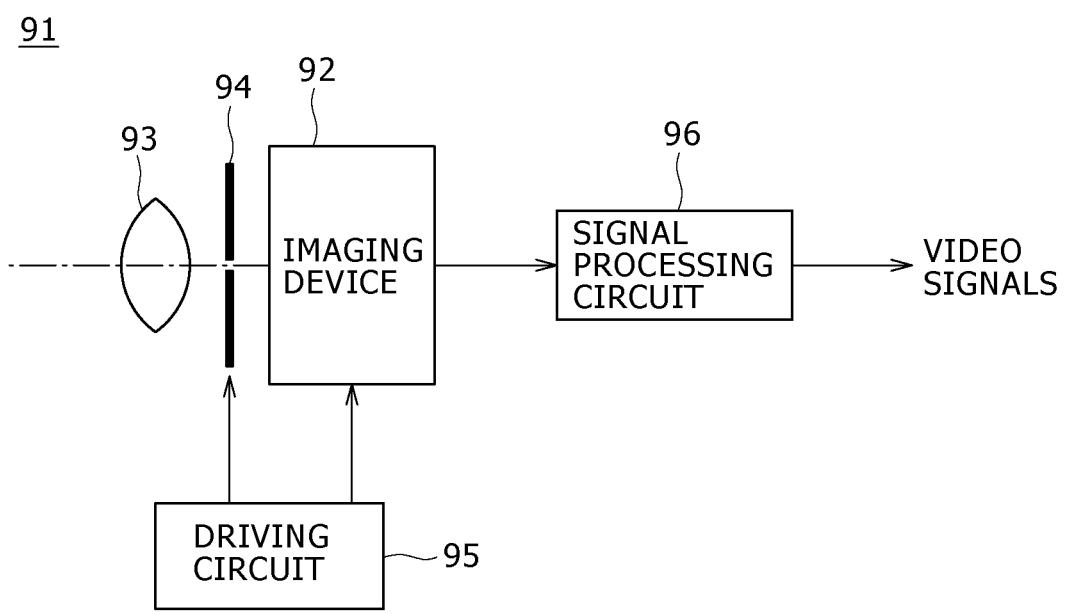
FIG. 16 is a schematic diagram showing the electronic instrument pertaining to the sixth embodiment of the present invention.
Figure 17:
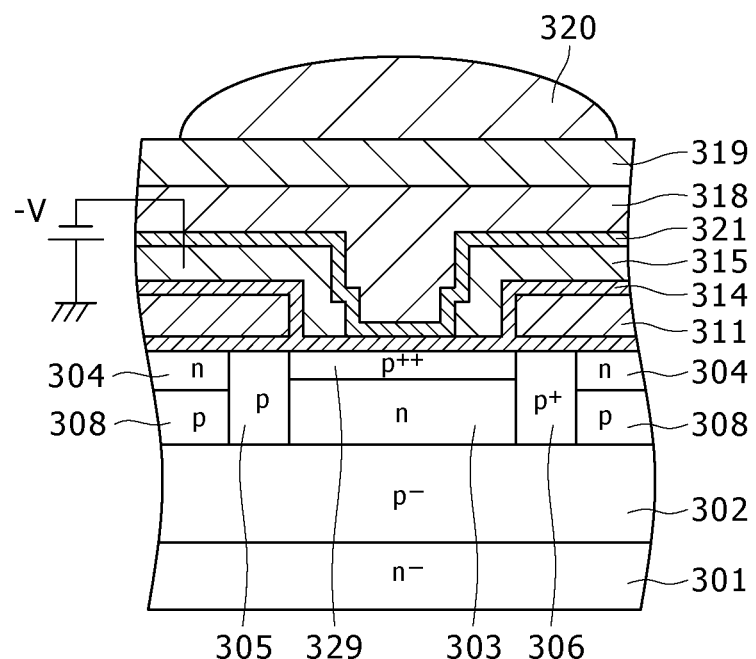
FIG. 17 is a sectional view showing important parts of an example of known CCD solid-state imaging devices.
Figure 18:
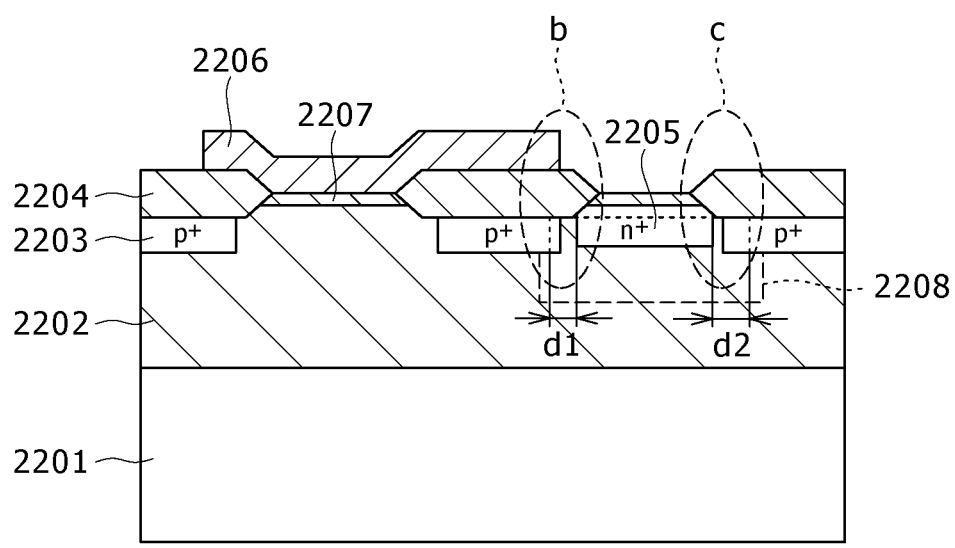
FIG. 18 is a sectional view showing important parts of an example of known CMOS solid-state imaging devices.
Figure 19A:
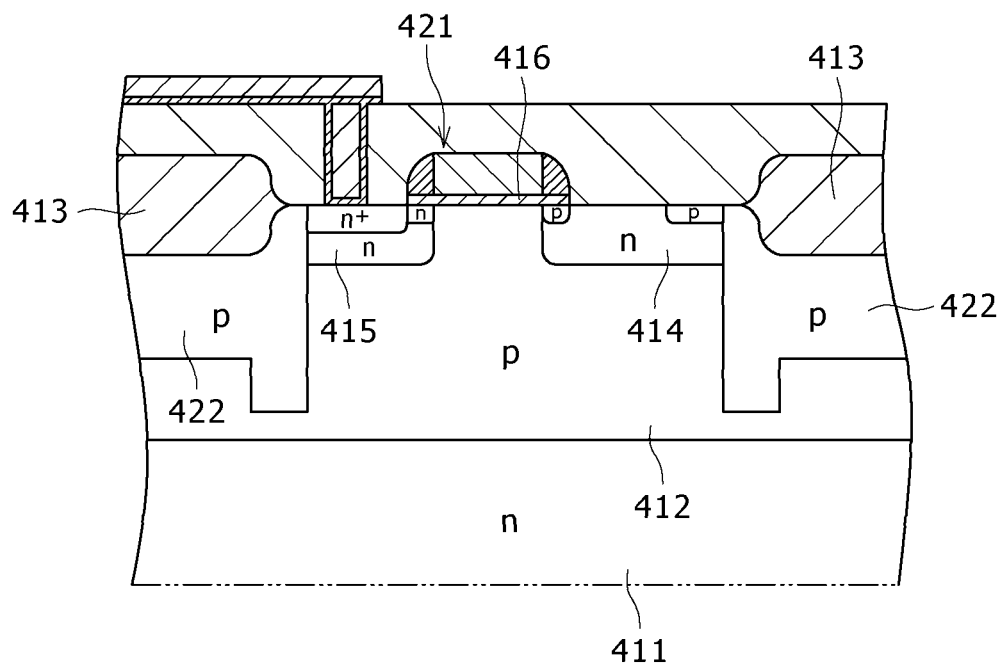
FIGS. 19A and 19B are sectional views showing important parts of another example of known CMOS solid-state imaging devices.
Figure 19B:
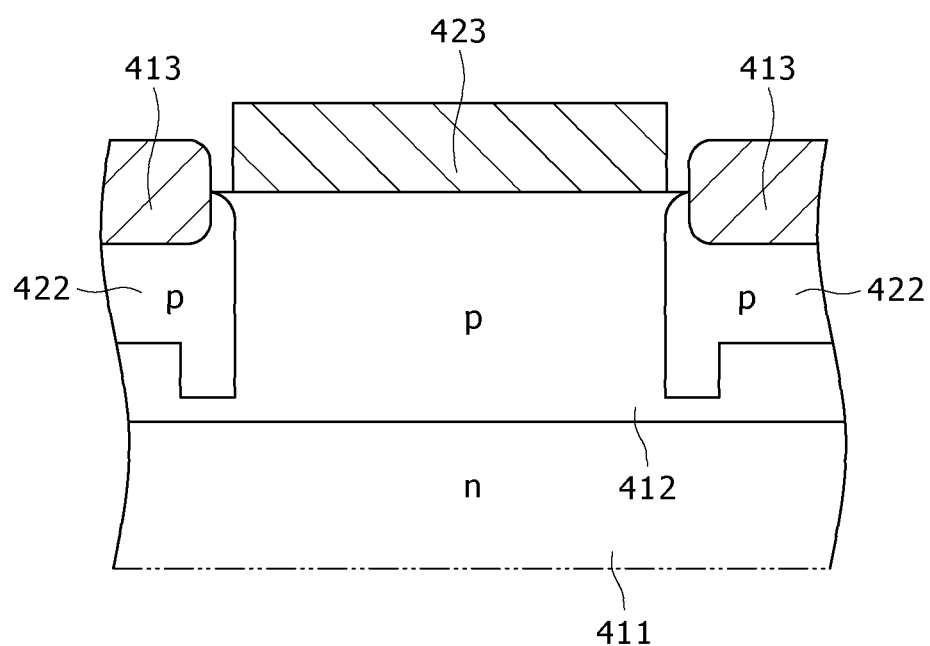

FIG. 16 shows a still or video camera as an example of the electronic instrument according to the sixth embodiment of the present invention. The camera 91 includes the solid-state imaging device 92, the optical system 93 which leads the incident light to the photodiode PD of the solid-state imaging device 92, and the shutter 94. The camera 91 additionally has the driving circuit 95 to drive the solid-state imaging device 92 and the signal processing circuit 96 to process the output signal from the solid-state imaging device 92.

The solid-state imaging device 92 is any one of those solid-state imaging devices pertaining to the above-mentioned embodiments. The optical system (optical lens) 93 permits the incident light from the object to form an image on the imaging plane of the solid-state imaging device 92. The thus formed image causes signal charges to accumulate for a prescribed period of time in the solid-state imaging device 92. The optical system 93 may be composed of a plurality of optical lenses. The shutter 94 controls the length of time for the solid-state imaging device 92 to be exposed to light and shielded from light. The driving circuit 95 sends out driving signals to control the transfer action of the solid-state imaging device 92 and the shutter action of the shutter 94. The driving signals (timing signals) sent from the driving circuit 95 permit the transfer of signals from the solid-state imaging device 92. The signal processing circuit 96 performs various kinds of signal processing. After signal processing, the image signals are stored in the memory (such as memory medium) or output to the monitor.

The electronic device, such as cameras, pertaining to the sixth embodiment produces high-quality images because the solid-state imaging device 92 suffers less leakage current (dark current) in the floating diffusion region and less variation in leakage current among pixels. Therefore, the present invention is useful for electronic instruments such as high-quality cameras.

The present application contains subject matter related to that disclosed in Japanese Priority Patent Application JP 2010-082772 filed in the Japan Patent Office on Mar. 31, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a semiconductor well region of a first conduction type;
a first semiconductor region of the first conduction type in the semiconductor well region, the first semiconductor region having an impurity concentration different than that of the semiconductor well region;

an isolation dielectric region on the first semiconductor region;

a photoelectric conversion part having a second semiconductor region of a second conduction type that is non-overlapping with the first semiconductor region in plan view;

pixel transistors in the first semiconductor region;

a floating diffusion region of the second conduction type in the semiconductor well region; and a depletion region between the first semiconductor region and the floating diffusion region.

2. The solid-state imaging device according to claim 1, further comprising:

an electrode on the first semiconductor region between the floating diffusion region and the isolation dielectric region, the electrode being configured to receive an application of a prescribed bias voltage.

3. The solid-state imaging device according to claim 2, wherein:

a portion of the depletion region exists on a surface of the semiconductor well region under the electrode, and the portion of the depletion region is not in contact with the isolation dielectric region.

4. A solid-state imaging device comprising:

a semiconductor well region of a first conduction type;

a first semiconductor region of the first conduction type in the semiconductor well region, the first semiconductor region having an impurity concentration different than that of the semiconductor well region;

a photoelectric conversion part having a second semiconductor region of a second conduction type that is non-overlapping with the first semiconductor region in plan view;

pixel transistors in the first semiconductor region;

a floating diffusion region of the second conduction type in the semiconductor well region; and a depletion region between the first semiconductor region and the floating diffusion region.

5. The solid-state imaging device according to claim 4, further comprising:

an insulating film with negative fixed charges on the first semiconductor region and between the floating diffusion region and the isolation dielectric region.

6. The solid-state imaging device according to claim 5, wherein:

a portion of the depletion region is on a surface of the semiconductor well region under the insulating film with fixed charges, and the portion of the depletion region is not in contact with the isolation dielectric region.

7. The solid-state imaging device according to claim 1, wherein the first semiconductor region has an impurity concentration that is greater than that of the semiconductor well region.

8. The solid-state imaging device according to claim 4, wherein the first semiconductor region has an impurity concentration that is greater than that of the semiconductor well region.

9. The solid-state imaging device according to claim 4, further comprising an isolation dielectric region on the first semiconductor region.

10. The solid-state imaging device according to claim 9, further comprising:

an electrode on the semiconductor well region, the electrode having a portion extending between floating diffusion region and the isolation dielectric region.

* * * * *